(12) United States Patent
Kimura

(10) Patent No.: US 8,208,283 B2
(45) Date of Patent: Jun. 26, 2012

(54) DATA HOLDING DEVICE

(75) Inventor: Hiromitsu Kimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 293 days.

(21) Appl. No.: 12/621,812

(22) Filed: Nov. 19, 2009

(65) Prior Publication Data

US 2010/0124094 A1    May 20, 2010

(30) Foreign Application Priority Data

Nov. 20, 2008   (JP) ................... 2008-296600

(51) Int. Cl.
*G11C 11/22* (2006.01)
(52) U.S. Cl. .......... 365/145; 365/189.11; 365/226
(58) Field of Classification Search .......... 365/145, 365/189.05, 189.11, 226
See application file for complete search history.

(56) References Cited

U.S. PATENT DOCUMENTS

| 6,809,952 B2 * | 10/2004 | Masui .......................... 365/145 |
| 7,042,784 B2 * | 5/2006 | Kang ........................ 365/210.1 |
| 7,336,525 B2 * | 2/2008 | Fujita et al. .................. 365/154 |
| 2004/0105302 A1 | 6/2004 | Fujimori | |

FOREIGN PATENT DOCUMENTS

JP    3737472    11/2005

* cited by examiner

*Primary Examiner* — David Lam
(74) *Attorney, Agent, or Firm* — Fish & Richardson P.C.

(57) ABSTRACT

A data holding device includes a loop structure portion for holding data by using a plurality of logic gates connected like a loop, and a nonvolatile storage portion for storing data held in the loop structure portion, in a nonvolatile manner by using a hysteresis characteristic of a ferroelectric element. The loop structure portion and the nonvolatile storage portion are driven by being respectively supplied with power supply voltages that are different from each other.

12 Claims, 28 Drawing Sheets

(a) <LAYOUT>

<ACTUAL SHAPE>

(b) <LAYOUT>

<ACTUAL SHAPE>

(a)

<LAYOUT>

<ACTUAL SHAPE>

(b)

<LAYOUT>

<ACTUAL SHAPE>

(c)

<LAYOUT>

<ACTUAL SHAPE>

<LAYOUT>

<ACTUAL SHAPE>

DATA HOLDING DEVICE

CROSS-REFERENCE TO RELATED APPLICATIONS

This application is based on Japanese Patent Application No. 2008-296600 filed on Nov. 20, 2008.

BACKGROUND OF THE INVENTION

1. Field of the Invention

The present invention relates to a data holding device, and in particular, relates to a nonvolatile technique thereof.

2. Description of Related Art

As a data holding device that is used for a sequential circuit such as a latch circuit, there is known a circuit having two inverter circuits connected in series like a loop, for example. However, such the data holding device usually holds data only in a volatile manner, so the data will be lost when the power supply is turned off. In other words, even if the power supply is turned on again, the data stored before the power supply is turned off cannot be restored.

Therefore, when a sequence process utilizing the latch circuit having the data holding device is interrupted for some reason, the power supply should not be turned off for holding the data, while the power is consumed. In addition, if the sequence process is interrupted by a power failure or other accident, it is necessary to restart the process from the beginning with a large loss of time.

In order to resolve this problem, Japanese Patent No. 3737472 (hereinafter referred to as Patent Document 1), which was filed by the same applicant, discloses and proposes a data holding device that uses a ferroelectric capacitor for holding data in a nonvolatile manner.

FIG. 27 illustrates a circuit of a data holding device according to a conventional example.

The data holding device illustrated in FIG. 27 includes a ferroelectric element CL connected to a signal line (a thick line in FIG. 27 on which held data shows up as a voltage signal) in a storage element having a loop structure portion (enclosed by a broken line in FIG. 27) constituted of inverters INVx and INVy.

When the power supply is turned off, a remanent polarization state of the ferroelectric element CL is set by using a voltage value on the signal line, so that data is written in the ferroelectric element CL. Such the writing action enables to store the data in a nonvolatile manner even after the power supply is turned off.

On the other hand, when the data written in the ferroelectric element CL is read out, the node N is set to a floating state after the power supply is turned on. Then, in this state, a voltage pulse is applied to an end of the ferroelectric element CL via the plate line PL, so that a voltage signal corresponding to the remanent polarization state of the ferroelectric element CL is generated at the node N. The voltage signal generated at the node N is decided to be 0 or 1 as data (0-1 decision) based on a threshold value of the inverter INVx.

According to the conventional data holding device described above, it is surely advantageous that data can be held even if the power supply is turned off.

However, the conventional data holding device described above has a disadvantage that the ferroelectric element CL in the storage element becomes a large load capacitance existing on the signal line in a normal operation, which may cause a decrease of speed or an increase of power consumption in the storage element.

In addition, the conventional data holding device described above is required to setting the node N to a floating state (to turn off both the pass switches SWx and SWy) when the data is read out, so that the charge corresponding to the remanent polarization state of the ferroelectric element CL does not leak to the power supply line or to the ground line. Therefore, the conventional data holding device described above needs four types of clock signals (CKA, /CKA, CKB and /CKB) as drive clock signals for the pass switches SWx and SWy, which may cause an increase of power consumption.

In addition, as illustrated in FIGS. 27 and 28, the conventional data holding device described above uses a capacitive coupling between the ferroelectric element CL and a gate capacitance of a transistor constituting the inverter INVx so as to read a voltage signal Vout corresponding to the remanent polarization state of the ferroelectric element CL. However, the capacitance of the ferroelectric element CL (an upward-sloping solid line in FIG. 28) has a large value (a few hundred farads) while the gate capacitance of the transistor constituting the inverter INVx (a downward-sloping solid line in FIG. 28) has a small value (a few farads). Therefore, the voltage signal Vout that shows up at the node N is as small as approximately 10 to 100 millivolts, so it is difficult to set the threshold value of the inverter INVx in accordance with the voltage signal Vout for performing the 0-1 decision of the read data in view of variation of elements.

In addition, a conventional CMOS circuit has a conspicuous problem that if the power supply voltage decreases to 0.6 volts, data inside the data holding device will change because of fluctuation of the power supply voltage due to on/off of the circuit block power supply, i.e., there is little power margin of the supply voltage with respect to the fluctuation.

In addition, a nonvolatile data holding device incorporating the ferroelectric element does not need the power supply voltage for holding the data, so the problem of changing data due to a fluctuation of the power supply voltage can be resolved. However, in view of characteristics of the ferroelectric element, it is difficult to drive the ferroelectric element by using the power supply voltage of 0.6 volts for writing data in the ferroelectric element. In other words, when the CMOS circuit is driven by the power supply voltage of 0.6 volts, it is difficult to use the same power supply voltage for driving the ferroelectric element.

On the contrary, when the CMOS circuit is driven by the power supply voltage of 3.3 volts, if the same power supply voltage is used for driving the ferroelectric element, unnecessarily large power will be consumed.

SUMMARY OF THE INVENTION

In view of the above-mentioned problem, it is an object of the present invention to provide a data holding device that can hold data in a nonvolatile manner even after the power supply is turned off without a decrease of speed or an increase of power consumption in the normal operation, and that can be incorporated appropriately in a device requiring any power supply voltage.

In order to achieve the above-mentioned object, a data holding device according to the present invention includes a loop structure portion for holding data by using a plurality of logic gates connected like a loop, a nonvolatile storage portion for storing data in a nonvolatile manner in the loop structure portion using hysteresis characteristics of the ferroelectric element, and a circuit separating portion for electrically separating the loop structure portion from the nonvolatile storage portion. The loop structure portion and the nonvolatile storage portion are driven by being supplied with a first and a second power supply voltages that are different from each other.

Note that other features, elements, steps, merits and characteristics of the present invention will be further clarified in the following detailed description of preferred embodiments and the attached drawings.

DETAILED DESCRIPTION OF THE PREFERRED EMBODIMENTS

Figure 1:
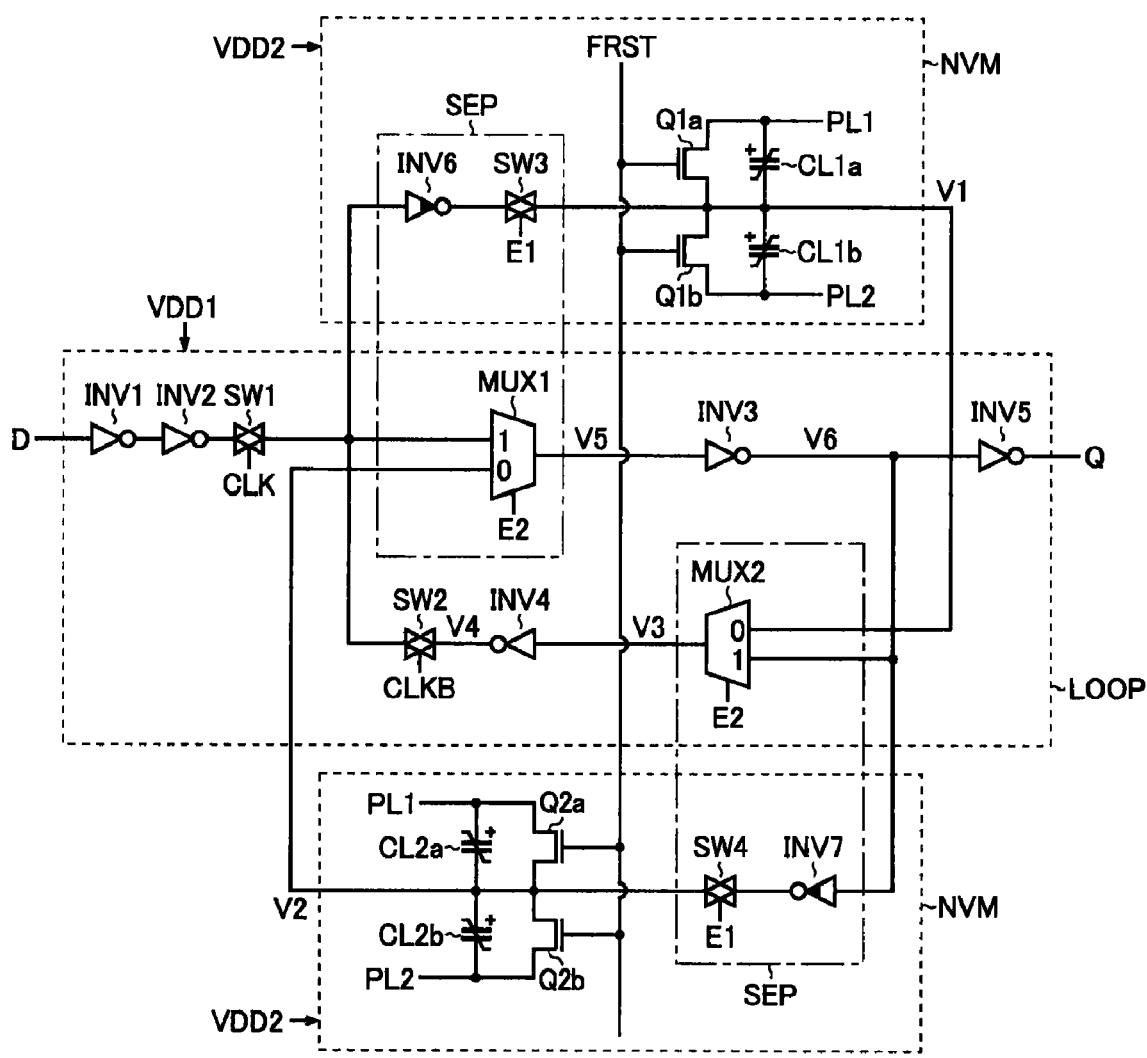
FIG. 1 is a circuit diagram illustrating an embodiment of a data holding device according to the present invention.

FIG. 1 is a circuit diagram illustrating an embodiment of a data holding device according to the present invention.

As illustrated in FIG. 1, the data holding device of the present embodiment is a latch circuit including inverters INV1 to INV7, pass switches SW1 to SW4, multiplexers MUX1 and MUX2, N-channel field-effective transistors Q1$a$, Q1$b$, Q2$a$ and Q2$b$, and ferroelectric elements (ferroelectric capacitors) CL1$a$, CL1$b$, CL2$a$ and CL2$b$.

An input end of the inverter INV1 is connected to a receiving end of a data signal (D). An output end of the inverter INV1 is connected to an input end of the inverter INV2. An output end of the inverter INV2 is connected to a first input end (1) of the multiplexer MUX1 via the pass switch SW1. An output end of the multiplexer MUX1 is connected to an input end of the inverter INV3. An output end of the inverter INV3 is connected to an input end of the inverter INV5. An output end of the inverter INV5 is connected to an outlet end of an output signal (Q). A first input end (1) of the multiplexer MUX2 is connected to an output end of the inverter INV3. An output end of the multiplexer MUX2 is connected to an input end of the inverter INV4. An output end of the inverter INV4 is connected to the first input end (1) of the multiplexer MUX1 via the pass switch SW2.

In this way, the data holding device of the present embodiment includes a loop structure portion LOOP for holding the input data signal D by using the two logic gate (the inverters INV3 and INV4 in FIG. 1) connected to each other like a loop.

Note that the loop structure portion LOOP is driven by being supplied with the first power supply voltage VDD1 (e.g., 0.6 volts).

An input end of the inverter INV6 is connected to the first input end (1) of the multiplexer MUX1. An output end of the inverter INV6 is connected to a second input end (0) of the multiplexer MUX2 via the pass switch SW3. An input end of the inverter INV7 is connected to the first input end (1) of the multiplexer MUX2. An output end of the inverter INV7 is connected to a second input end (0) of the multiplexer MUX1 via the pass switch SW4.

A positive end of the ferroelectric element CL1$a$ is connected to a first plate line PL1. A negative end of the ferroelectric element CL1$a$ is connected to the second input end (0) of the multiplexer MUX2. A transistor Q1$a$ is connected between the ends of the ferroelectric element CL1$a$. A gate of the transistor Q1$a$ is connected to a receiving end of an F reset signal FRST.

A positive end of the ferroelectric element CL1$b$ is connected to the second input end (0) of the multiplexer MUX2. A negative end of the ferroelectric element CL1$b$ is connected to a second plate line PL2. A transistor Q1$b$ is connected between the ends of the ferroelectric element CL1$b$. A gate of the transistor Q1$b$ is connected to the receiving end of the F reset signal FRST.

A positive end of the ferroelectric element CL2a is connected to the first plate line PL1. A negative end of the ferroelectric element CL2a is connected to the second input end (0) of the multiplexer MUX1. A transistor Q2a is connected between the ends of the ferroelectric element CL2a. A gate of the transistor Q2a is connected to the receiving end of the F reset signal FRST.

A positive end of the ferroelectric element CL2b is connected to the second input end (0) of the multiplexer MUX1. A negative end of the ferroelectric element CL2b is connected to the second plate line PL2. A transistor Q2b is connected between the ends of the ferroelectric element CL2b. A gate of the transistor Q2b is connected to the receiving end of the F reset signal FRST.

In this way, the data holding device of the present embodiment includes a nonvolatile storage portion NVM for storing the data D held by the loop structure portion LOOP, by using hysteresis characteristic of the ferroelectric elements (CL1a, CL1b, CL2a and CL2b) in a nonvolatile manner.

Note that the nonvolatile storage portion NVM is driven by being supplied with a second power supply voltage VDD2 (e.g., 1.2 volts) that is higher than the first power supply voltage VDD1.

In addition, among the structural elements described above, the pass switch SW1 is turned on and off in accordance with a clock signal CLK, and the pass switch SW2 is turned on and off in accordance with a reverse clock signal CLKB (logical inversion signal of the clock signal CLK). In other words, the pass switch SW1 and the pass switch SW2 are turned on and off exclusively (complementarily) to each other.

On the other hand, each of the pass switches SW3 and SW4 is turned on and off in accordance with a control signal E1. In addition, each of the multiplexers MUX1 and MUX2 has signal paths that are switched in accordance with a control signal E2. In other words, in the data holding device of the present embodiment, the multiplexers MUX1 and MUX2, the inverters INV6 and INV7, and the pass switches SW3 and SW4 function as a circuit separating portion SEP for electrically separating the loop structure portion LOOP and the nonvolatile storage portion NVM from each other.

Note that among the circuit elements constituting the circuit separating portion SEP, the multiplexers MUX1 and MUX2 included in the loop structure portion LOOP are driven by being supplied with the first power supply voltage VDD1, and the pass switches SW3 and SW4 included in the nonvolatile storage portion NVM are driven by being supplied with the second power supply voltage VDD2.

In addition, the inverters INV6 and INV7 are driven by being supplied with both the first power supply voltage VDD1 and the second power supply voltage VDD2, and have a function as a level shifter for converting a voltage level of the data D to be communicated between the loop structure portion LOOP and the nonvolatile storage portion NVM.

Figure 2:
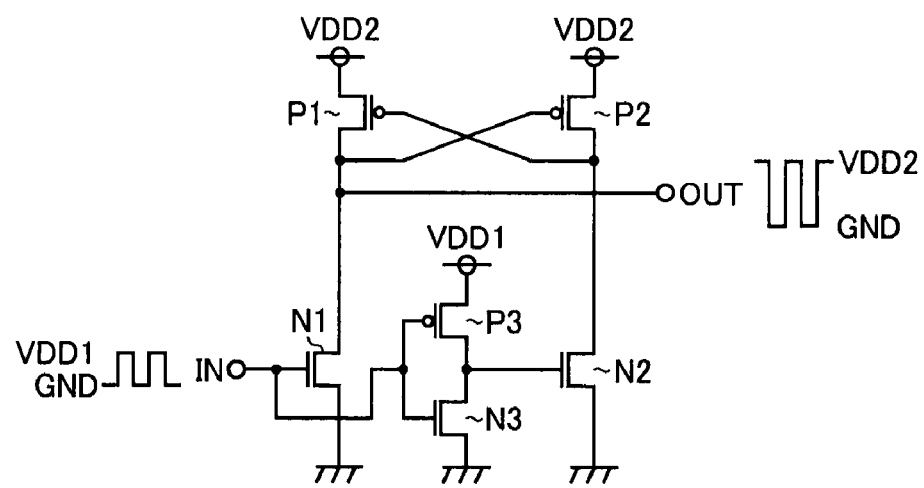
FIG. 2 is a circuit diagram illustrating a structural example of an inverter INV6 (as well as an inverter INV7) having a level shifting function.

FIG. 2 is a circuit diagram illustrating a structural example of the inverter INV6 (as well as the inverter INV7) having the level shifting function.

As illustrated in FIG. 2, the inverter INV6 (INV7) is constituted of a P-channel MOS field-effect transistors P1 to P3 and N-channel MOS field-effect transistors N1 to N3. A gate of the transistor N1 is connected to the input end IN. A source of the transistor N1 is connected to a ground end. A drain of the transistor N1 is connected to a drain of the transistor P1 and is also connected to the output end OUT. Each of sources of the transistors P1 and P2 is connected to a receiving end of the second power supply voltage VDD2. A gate of the transistor P1 is connected to a drain of the transistor P2. A gate of the transistor P2 is connected to the drain of the transistor P1. The drain of the transistor P2 is connected to a drain of the transistor N2. A source of the transistor N2 is connected to the ground end. Each of gates of the transistors P3 and N3 is connected to the input end IN. A source of the transistor P3 is connected to a receiving end of the first power supply voltage VDD1. A drain of the transistor P3 is connected to a drain of the transistor N3 and is also connected to a gate of the transistor N2. A source of the transistor N3 is connected to the ground end.

In the inverter INV6 (INV7) having the above-mentioned structure, if a logical signal of a high level (first power supply voltage VDD1) is supplied to the input end IN, the transistors N1 and P2 are tuned on while the transistors N2 and P1 are turned off. Therefore, a logical signal of a low level (ground voltage GND) is delivered from the output end OUT. On the contrary, if a logical signal of the low level (ground voltage GND) is supplied to the input end IN, the transistors N1 and P2 is turned off while the transistors N2 and P1 are turned on. Therefore, a logical signal of a high level (second power supply voltage VDD2) is delivered from the output end OUT. In other words, the inverter INV6 (INV7) reverses logic levels of the logical signal supplied to the input end IN and further raises the high level potential from the first power supply voltage VDD1 to the second power supply voltage VDD2 for output.

Next, operations of the data holding device having the above-mentioned structure will be described in detail. Note that in the following description, node voltages at individual portions are denoted as below. A voltage at the connection node between the ferroelectric elements CL1a and CL1b is denoted by V1, a voltage at the connection node between the ferroelectric elements CL2a and CL2b is denoted by V2, a voltage at the input end of the inverter INV4 is denoted by V3, a voltage at the output end of the inverter INV4 is denoted by V4, a voltage at the input end of the inverter INV3 is denoted by V5, and a voltage at the output end of the inverter INV3 is denoted by V6.

Figure 3:
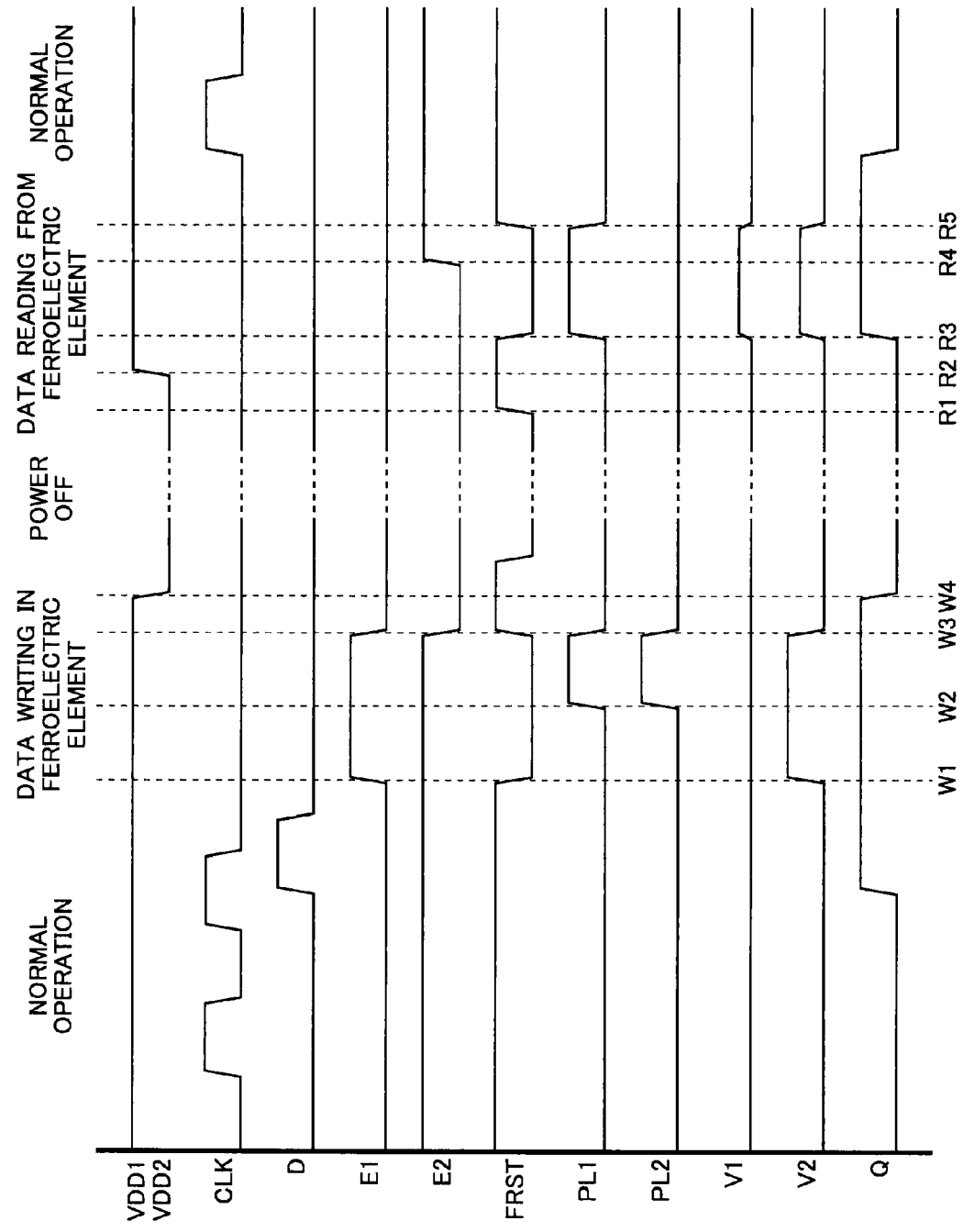
FIG. 3 is a timing chart illustrating an operational example of a data holding device according to the present invention.

FIG. 3 is a timing chart illustrating an operational example of the data holding device according to the present invention. From above in FIG. 3, there are illustrated voltage waveforms of the power supply voltages (VDD1 and VDD2), the clock signal CLK, the data signal D, the control signal E1, the control signal E2, the F reset signal FRST, the applied voltage to the first plate line PL1, the applied voltage to the second plate line PL2, the node voltage V1, the node voltage V2, and the output signal Q, in this order.

First, a normal operation of the data holding device will be described.

Until a time point W1, the F reset signal FRST is "1" (high level of VDD2), and the transistors Q1a, Q1b, Q2a and Q2b are turned on, so that each of the ferroelectric elements CL1a, CL1b, CL2a and CL2b is short-circuited at the ends. Therefore, no voltage is applied to the ferroelectric elements CL1a, CL1b, CL2a and CL2b. Note that each of the first plate line PL1 and the second plate line PL2 is "0" (low level of GND).

In addition, until the time point W1, the control signal E1 is "0" (GND), so that the pass switch SW3 and the pass switch SW4 are turned off. Therefore, each of data write drivers (inverters INV6 and INV7 in the example of FIG. 1) is disabled.

In addition, until the time point W1, the control signal E2 is "1" (VDD1), so that the first input ends (1) of the multiplexer MUX1 and the multiplexer MUX2 are selected. Therefore, a normal loop is formed in the loop structure portion LOOP.

Therefore, in the period while the clock signal CLK is the high level, the pass switch SW1 is turned on while the pass switch SW2 is turned off, so that the data signal D becomes the output signal Q as it is. On the other hand, in the period while the clock signal CLK is the low level, the pass switch SW1 is turned off while the pass switch SW2 is turned on, so that the data signal D is latched at the trailing edge of the clock signal CLK.

Figure 4:
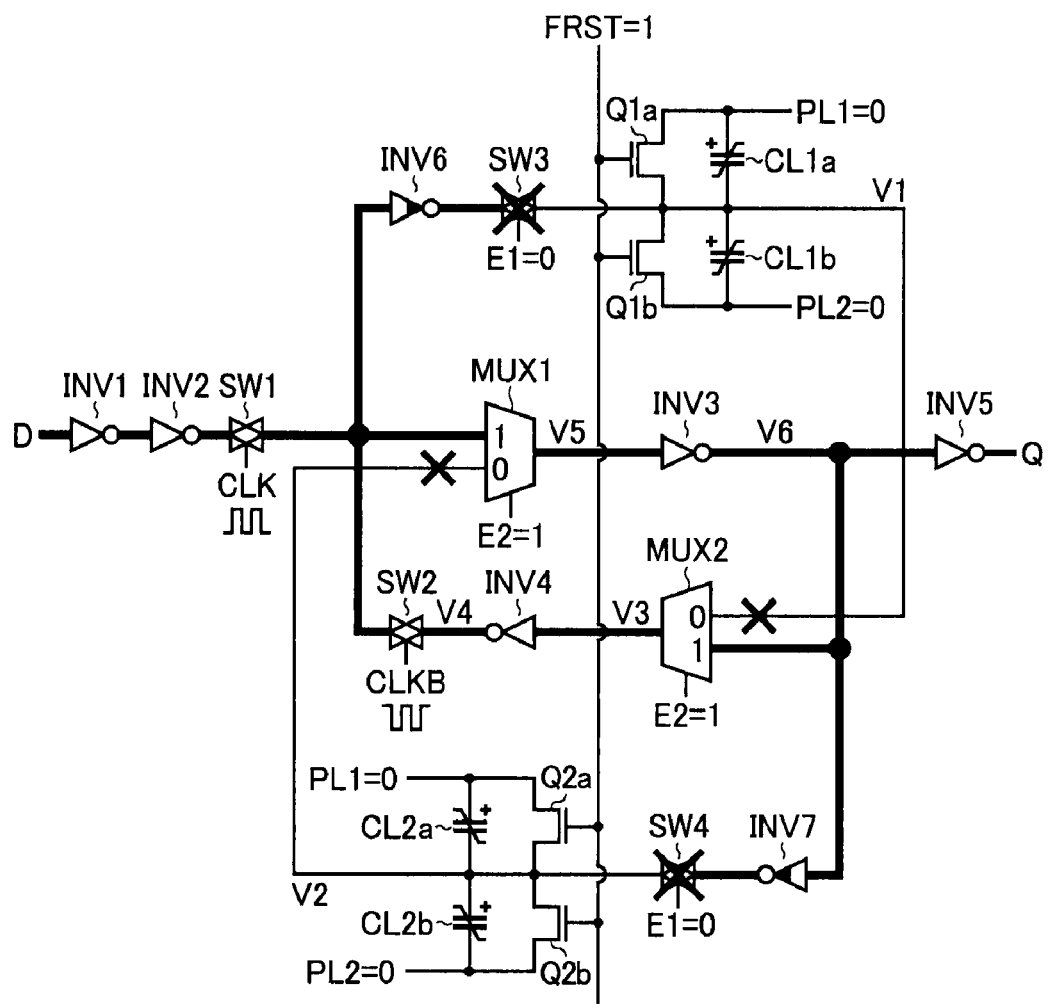
FIG. 4 is a circuit diagram illustrating a signal path in a normal operation.

Note that FIG. 4 is a circuit diagram illustrating a signal path (with thick lines in FIG. 4) in the normal operation described above.

Next, a data writing action in the ferroelectric element will be described.

During the time points W1 to W3, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data writing action in the ferroelectric element can be enhanced.

In addition, during the time points W1 to W3, the F reset signal FRST is "0" (GND), and the transistors Q1a, Q1b, Q2a and Q2b are turned off, so that a voltage can be applied to the ferroelectric elements CL1a, CL1b, CL2a and CL2b.

In addition, during the time points W1 to W3, the control signal E1 is "1" (VDD2) so that the pass switch SW3 and the pass switch SW4 are turned on. Therefore, each of the data write drivers (inverters INV6 and INV7 in the example of FIG. 1) becomes enabled.

Note that during the time points W1 to W3, similarly to before, the control signal E2 is "1" (VDD1) so that the first input ends (1) of the multiplexer MUX1 and the multiplexer MUX2 are selected. Therefore, the normal loop is formed in the loop structure portion LOOP.

In addition, during the time points W1 to W2 the first plate line PL1 and the second plate line PL2 are "0" (GND), and during the time points W2 to W3 the first plate line PL1 and the second plate line PL2 are "1" (VDD2). In other words, the same pulse voltage is applied to the first plate line PL1 and the second plate line PL2. By such the application of the pulse voltage, the remanent polarization state inside the ferroelectric element is set to either an inverted state or a non-inverted state.

With reference to the example of FIG. 3, more concrete description will be given below. At the time point W1, the output signal Q is "1" (VDD1). Therefore, the node voltage V1 becomes "0" (GND), and the node voltage V2 becomes "1" (VDD2). Therefore, during the time points W1 to W2 while the first plate line PL1 and the second plate line PL2 are "0" (GND), no voltage is applied between the ends of the ferroelectric elements CL1a and CL1b, a negative voltage is applied between the ends of the ferroelectric element CL2a, and a positive voltage is applied between the ends of the ferroelectric element CL2b. On the other hand, during the time points W2 to W3 while the first plate line PL1 and the second plate line PL2 are "1" (VDD2), no voltage is applied between the ends of the ferroelectric elements CL2a and CL2b, a positive voltage is applied between the ends of the ferroelectric element CL1a, and a negative voltage is applied between the ends of the ferroelectric element CL1b.

In this way, the pulse voltage is applied to the first plate line PL1 and the second plate line PL2, so that the remanent polarization state inside the ferroelectric element is set to either the inverted state or the non-inverted state. Note that the remanent polarization state becomes opposite between the ferroelectric elements CL1a and CL1b as well as between the ferroelectric elements CL2a and CL2b. In addition, also between the ferroelectric elements CL1a and CL2a as well as between the ferroelectric elements CL1b and CL2b, the remanent polarization state becomes opposite.

At the time point W3, the F reset signal FRST becomes "1" (VDD2) again, and the transistors Q1a, Q1b, Q2a and Q2b are turned on, so that each of the ferroelectric elements CL1a, CL1b, CL2a and CL2b is short-circuited at the ends. Therefore, no voltage can be applied to the ferroelectric elements CL1a, CL1b, CL2a and CL2b. In this case, each of the first plate line PL1 and the second plate line PL2 is "0" (GND).

In addition, at the time point W3, the control signal E1 becomes "0" (GND) again, and the pass switch SW3 and the pass switch SW4 are turned off, so that each of the data write drivers (inverters INV6 and INV7 in the example of FIG. 1) becomes disabled. Note that the control signal E2 is not minded but is "0" (GND) in the example of FIG. 3.

Then, at the time point W4, supply of the first power supply voltage VDD1 to the loop structure portion LOOP and supply of the second power supply voltage VDD2 to the nonvolatile storage portion NVM are both interrupted. In this case, the F reset signal FRST is maintained to be "1" (VDD2) from the time point W3, and the transistors Q1a, Q1b, Q2a and Q2b are turned on, so that each of the ferroelectric elements CL1a, CL1b, CL2a and CL2b is short-circuited at the ends. Therefore, no voltage is applied to the ferroelectric elements CL1a, CL1b, CL2a and CL2b. Even if a voltage fluctuation occurs when the power supply is interrupted, no voltage is applied to the ferroelectric elements CL1a, CL1b, CL2a and CL2b without intention, so that changing data can be avoided.

Figure 5:
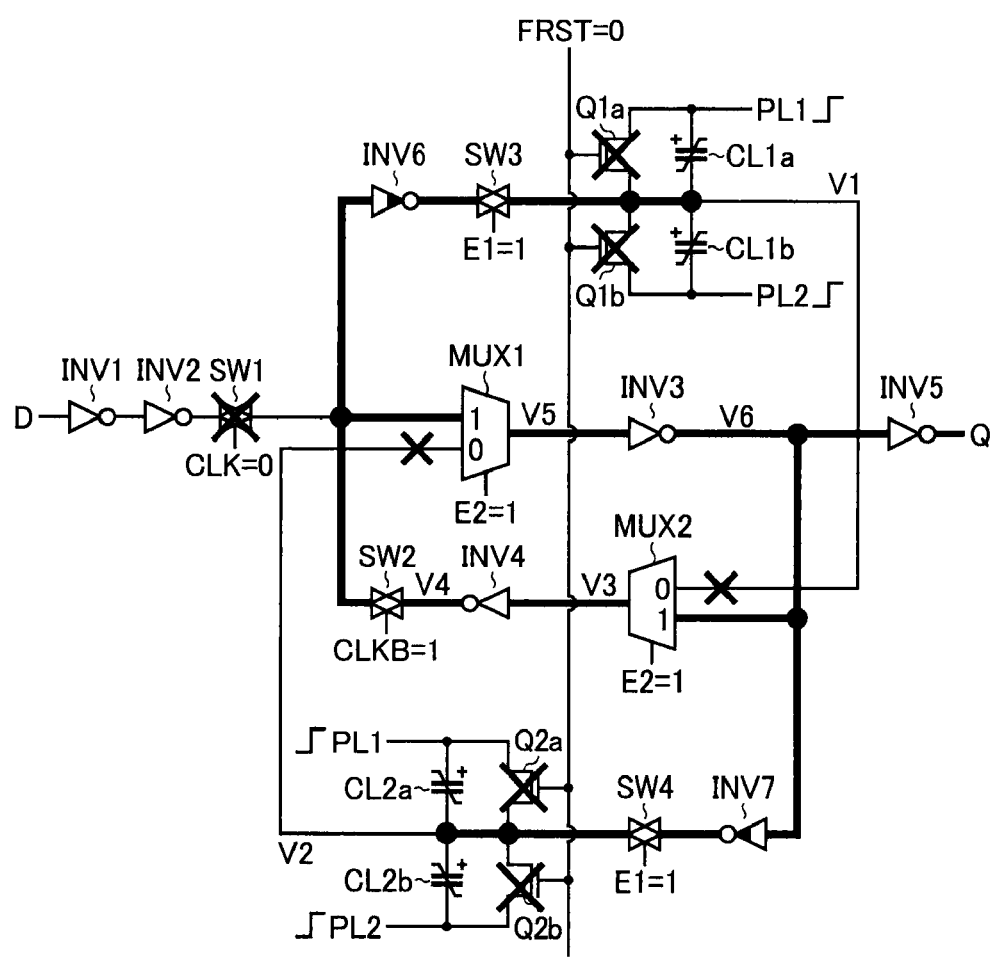
FIG. 5 is a circuit diagram illustrating a signal path in a data writing action.

Note that FIG. 5 is a circuit diagram illustrating a signal path (with thick lines in FIG. 5) in the above-mentioned data writing action (in particular, during the time points W1 to W3).

Next, a data reading action from the ferroelectric element will be described.

During the time points R1 to R5, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data reading action from the ferroelectric element can be enhanced.

At the time point R1, the F reset signal FRST is "1" (VDD1) first, and the transistors Q1a, Q1b, Q2a and Q2b are turned on, so that each of the ferroelectric elements CL1a, CL1b, CL2a and CL2b is short-circuited at the ends. Therefore, no voltage can be applied to the ferroelectric elements CL1a, CL1b, CL2a and CL2b. Even if a voltage fluctuation occurs when the power supply is turned on, no voltage is applied to the ferroelectric elements CL1a, CL1b, CL2a and CL2b without intention, so that changing data can be avoided.

Note that at the time point R1, each of the first plate line PL1 and the second plate line PL2 is "0" (low level of GND).

Figure 6:
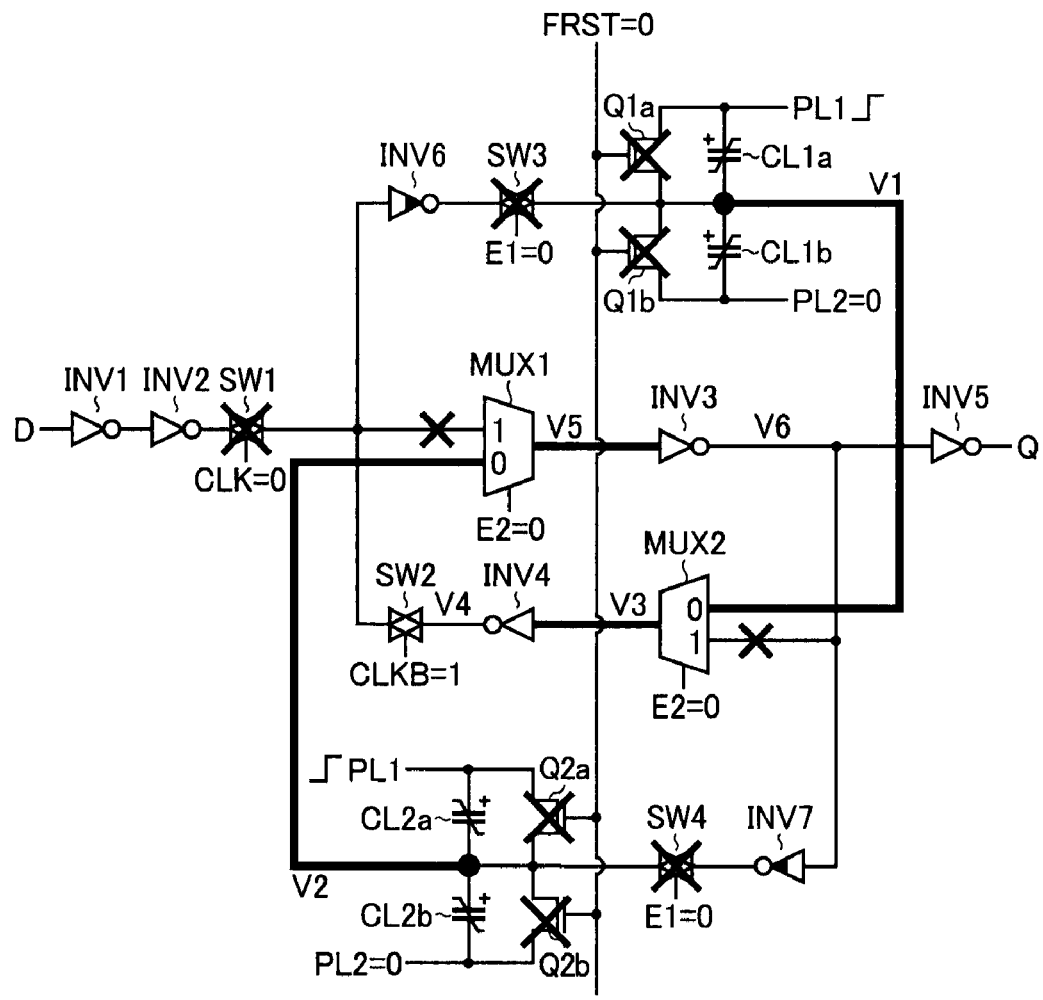
FIG. 6 is a circuit diagram illustrating a signal path in a data reading action.

At the time point R2, in the state where each of the control signals E1 and E2 is "0" (GND) (i.e., in the state where the data write drivers are disabled and the normal loop is disabled in the loop structure portion LOOP), the first power supply voltage VDD1 for the loop structure portion LOOP and the second power supply voltage VDD2 for the nonvolatile storage portion NVM are turned on. In this case, the signal line indicated with the thick lines in FIG. 6 is in a floating state.

At the next time point R3, the F reset signal FRST becomes "0" (GND), so that the transistors Q1a, Q1b, Q2a and Q2b are turned off. Then, a voltage can be applied to the ferroelectric elements CL1a, CL1b, CL2a and CL2b while the second plate line PL2 is maintained to be "0" (GND) and the first plate line PL1 becomes "1" (VDD2). By such the application of the pulse voltage, voltage signals corresponding to the remanent polarization state inside the ferroelectric element show up as the node voltage V1 and the node voltage V2.

With reference to an example of FIG. 3, concrete description will be given below. As the node voltage V1, a relatively low voltage signal (hereinafter a logic level thereof is denoted by WL (weak Low)) shows up. As the node voltage V2, a relatively high voltage signal (hereinafter a logic level thereof is denoted by WH (weak high)) shows up. In other words, a voltage difference corresponding to a difference of the remanent polarization state in the ferroelectric element occurs between the node voltage V1 and the node voltage V2.

In this case, during the time points R3 to R4, the control signal E2 is "0" (VDD1), and the second input ends (0) of the multiplexer MUX1 and the multiplexer MUX2 are selected. Therefore, a logic level of the node voltage V3 becomes WL, and a logic level of the node voltage V4 becomes WH. In addition, a logic level of the node voltage V5 becomes WH, and a logic level of the node voltage V6 becomes WL. In this way, during the time points R3 to R4, the node voltages V1 to V6 at the individual portions of the device are still unstable (in the state where logic level inversion is not completed in the inverter INV3 and the inverter INV4 so that output logic levels thereof are not completely "0" (GND) or "1" (VDD1)).

At the next time point R4, the control signal E2 becomes "1" (VDD1), and the first input ends (1) of the multiplexer MUX1 and the multiplexer MUX2 are selected, so that the normal loop is formed in the loop structure portion LOOP. As the signal path is switched in this way, the output end (logic level of WH) of the inverter INV4 and the input end (logic level of WH) of the inverter INV3 are connected to each other while the output end (logic level of WL) of the inverter INV3 and the input end (logic level of WL) of the inverter INV4 are connected to each other. Therefore, no mismatch occurs in the signal logic levels (WH or WL) of the nodes. After that, in the period while the normal loop is formed in the loop structure portion LOOP, the inverter INV3 receives the input of the logic level WL and tries to raise the output logic level to "1" (VDD1), and the inverter INV4 receives the input of the logic level WH and tries to lower the output logic level to "0" (GND). As a result, the output logic level of the inverter INV3 is fixed to be "0" (GND) from the unstable logic level WL, and the output logic level of the inverter INV4 is fixed to be "1" (VDD1) from the unstable logic level WH.

In this way, as the loop structure portion LOOP is made to be the normal loop at the time point R4, a signal read from the ferroelectric element (a potential difference between the node voltage V1 and the node voltage V2) is amplified by the loop structure portion LOOP, so that the held data before the power supply is interrupted ("1" (VDD1) in the example of FIG. 2) is restored as the output signal Q.

After that, at the time point R5, the F reset signal FRST becomes "1" (VDD2) again, so that the transistors Q1a, Q1b, Q2a and Q2b are turned on. Then, each of the ferroelectric elements CL1a, CL1b, CL2a and CL2b is short-circuited at the ends, so that no voltage can be applied to the ferroelectric elements CL1a, CL1b, CL2a and CL2b. In this case, the first plate line PL1 and the second plate line PL2 are both "0" (GND). Therefore, the data holding device is reset to the state similar to the state before the time point W1, i.e., the normal operation state.

Note that FIG. 6 is a circuit diagram illustrating a signal path (with thick lines in FIG. 6) in the above-mentioned data reading action (particularly, during the time points R3 to R4).

As described above, the data holding device of the present embodiment includes the loop structure portion LOOP for holding data by using the logic gates (inverters INV3 and INV4 in FIG. 1) connected to each other like a loop, the nonvolatile storage portion NVM (CL1a, CL1b, CL2a, CL2b, Q1a, Q1b, Q2a and Q2b) for storing the data held in the loop structure portion LOOP, in a nonvolatile manner by using hysteresis characteristic of the ferroelectric elements, and the circuit separating portion SEP (MUX1, MUX2, INV6, INV7, SW3 and SW4) for electrically separating the loop structure portion LOOP and the nonvolatile storage portion NVM from each other. The circuit separating portion SEP has the structure for operating the loop structure portion LOOP electrically while maintaining the applied voltage to the ferroelectric elements to be constant in the normal operation of the data holding device.

In this way, instead of driving the ferroelectric elements CL1a, CL1b, CL2a and CL2b directly from the signal line of the loop structure portion LOOP, the data write drivers (inverters INV6 and INV7 in FIG. 1) that also function as buffers are disposed between the signal line of the loop structure portion LOOP and the ferroelectric elements CL1a, CL1b, CL2a and CL2b, so that the ferroelectric elements CL1a, CL1b, CL2a and CL2b cannot be load capacitance inside the loop structure portion LOOP.

In addition, the pass switches SW3 and SW4 are connected to the output ends of the data write drivers (inverters INV6 and INV7), so that the pass switches SW3 and SW4 are turned on in accordance with the control signal E1 only in the data writing action. Thus, it is possible that the ferroelectric elements CL1a, CL1b, CL2a and CL2b are not driven in the normal operation.

In addition, in the data reading action, input and output paths of the multiplexers MUX1 and MUX2 are switched in accordance with the control signal E2, so that connection or interruption between the logic gates (inverters INV3 and INV4 in FIG. 1) in the loop structure portion LOOP and the ferroelectric elements CL1a, CL1b, CL2a and CL2b can be controlled. Therefore, an increase of power consumption can be avoided because a specific node is in the floating state so that it is needless to add a clock line having a large load.

Note that the additional control signals E1 and E2 are necessary for the data holding device of the present embodiment, but these signals are not driven at all in the normal operation unlike the clock signal that is always driven. Therefore, there is little influence to power consumption of the data holding device.

In addition, the additional data write drivers (inverters INV6 and INV7) and the additional multiplexers MUX1 and MUX2 are necessary for the data holding device of the present embodiment, but an occupancy area of the data holding device in an arithmetic circuit of a central processing unit (CPU) or the like is as small as a few percent in most cases, so it can be said that an increase of the area hardly affect the entire arithmetic circuit.

In this way, the data holding device of the present embodiment does not drive the ferroelectric element wastefully in the normal operation, so that high speed and low power consumption at the same level as the nonvolatile data holding device can be achieved.

In other words, the data holding device can be handled in the same manner as the nonvolatile data holding device, a storage element portion of an existing circuit can be replaced by the data holding device of the present invention without redesigning timings, power consumption or the like. Therefore, the existing circuit can be easily made to be nonvolatile. As a result, for example, it is possible to realize a CPU or the like that is capable of interrupting power supply without erasing data in a standby mode and resuming the operation promptly when the power supply is turned on.

In addition, in the data holding device of the present embodiment, the loop structure portion LOOP and the nonvolatile storage portion NVM are driven by being supplied with the first and the second power supply voltages VDD1 and VDD2, respectively. The circuit separating portion SEP includes a level shifter for converting a voltage level of data D communicated between the loop structure portion LOOP and the nonvolatile storage portion NVM (inverters INV6 and INV7 having a level shifting function in the example of FIG. 1).

With such the structure, it is possible to achieve low voltage drive of the loop structure portion LOOP with the first power supply voltage VDD1 and appropriate drive of the nonvolatile storage portion NVM (more specifically, the ferroelectric elements CL1a, CL1b, CL2a and CL2b included in the nonvolatile storage portion NVM) with the second power supply voltage VDD2 that is higher than the first power supply voltage VDD1. Therefore, it is possible to provide the data holding device that can be appropriately incorporated in a low voltage drive device (ultra-low voltage processor or the like).

Figure 7:
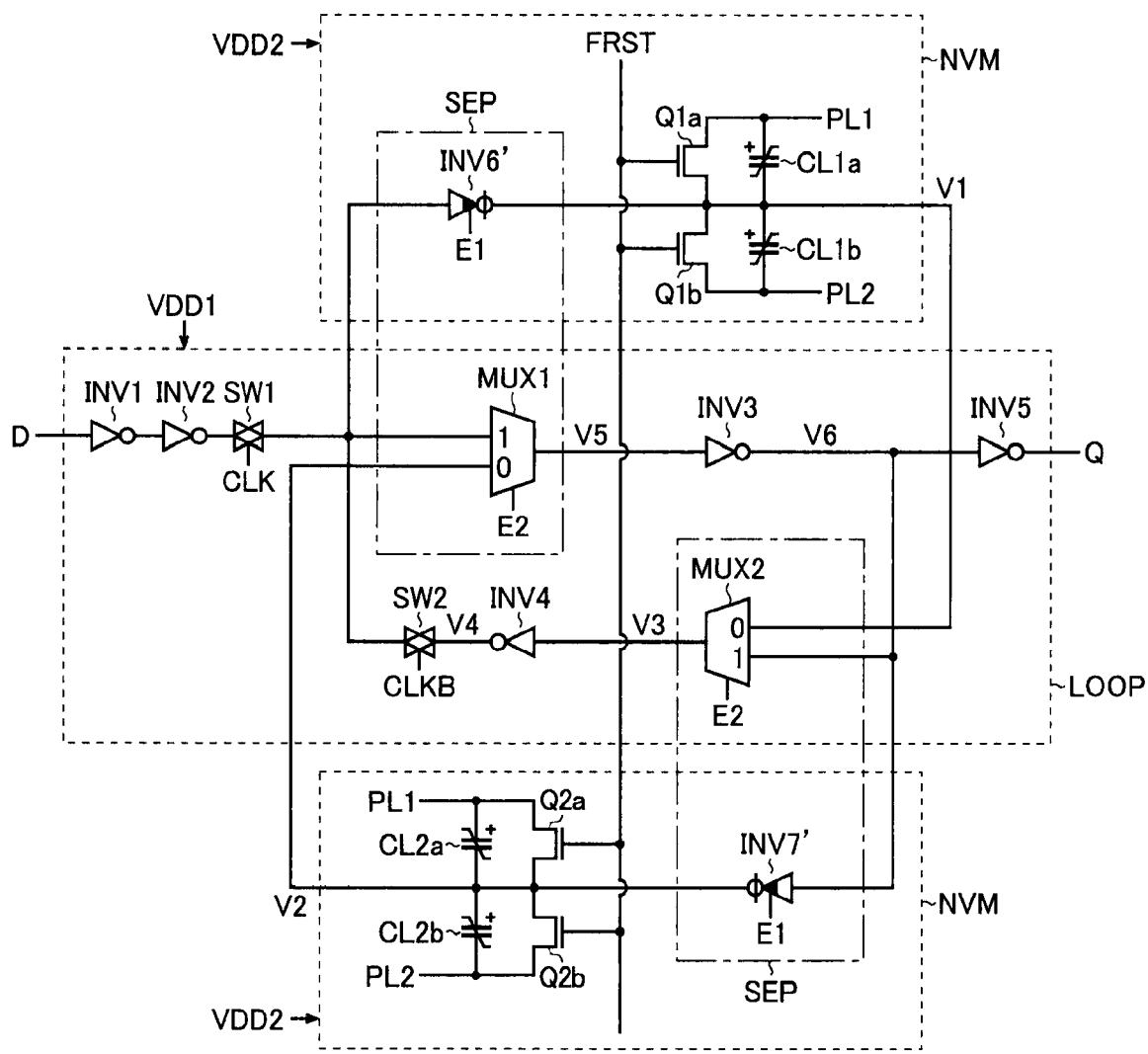
FIG. 7 is a circuit diagram illustrating a first variation example of the data holding device according to the present invention.

Note that the above-mentioned embodiment exemplifies the structure in which the inverter INV6 and the pass switch SW3 are combined, and the inverter INV7 and the pass switch SW4 are combined. However, the present invention is not limited to this structure. As illustrated in FIG. 7, it is possible to use three-state inverters INV6' and INV7' that can make the output state a high impedance state in accordance with the control signal E1, so that the pass switches SW3 and SW4 can be eliminated. In this case, the structure of the inverter INV6' (as well as the inverter INV7') is as illustrated in FIG. 8.

Figure 8:
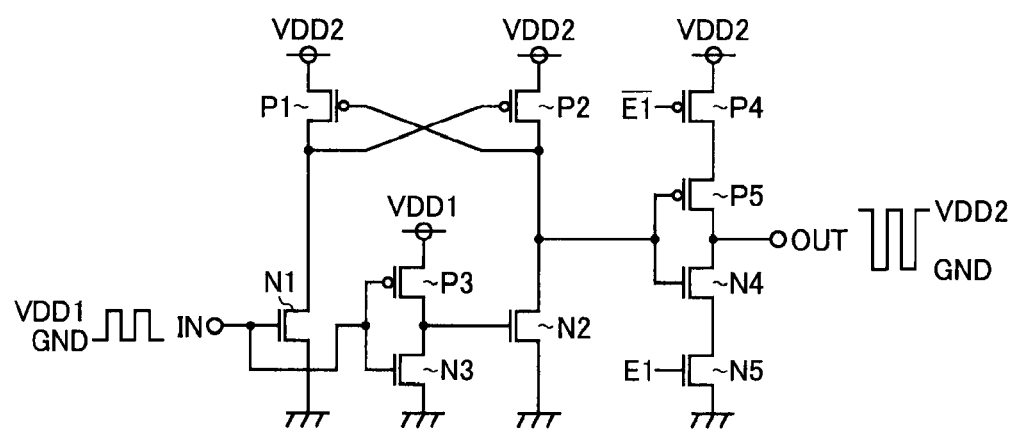
FIG. 8 is a circuit diagram illustrating a structural example of a three-state inverter INV6' (as well as inverter INV7') having the level shifting function.

FIG. 8 is a circuit diagram illustrating a structural example of the three-state inverter INV6' (as well as the inverter INV7') having the level shifting function.

As illustrated in FIG. 8, the three-state inverter INV6' (INV7') having the level shifting function can be easily realized by making some modifications to the inverter INV6 (INV7) described above. More specifically, in addition to the structure of FIG. 2, the three-state inverter INV6' (INV7') should be equipped with an additional output stage including P-channel MOS field-effect transistors P4 and P5, and N-channel MOS field-effect transistors N4 and N5. Further, the structure in which the output signal is delivered from the drain of the transistor P1 should be replaced by the structure in which the output signal is delivered from the above-mentioned output stage.

A source of the transistor P4 forming the above-mentioned output stage is connected to the receiving end of the second power supply voltage VDD2. A gate of the transistor P4 is connected to a receiving end of an inversion control signal E1-bar. A drain of the transistor P4 is connected to a source of the transistor P5. A drain of the transistor P5 is connected to a drain of the transistor N4 and is also connected to the output end OUT. Each of gates of the transistors P5 and N4 is connected to the drain of the transistor P2. A source of the transistor N4 is connected to the drain of the transistor N5. A source of the transistor N5 is connected to the ground end. A gate of the transistor N5 is connected to a receiving end of the control signal E1.

If the control signal E1 is the high level (second power supply voltage VDD2) in the three-state inverter INV6' (INV7') having the above-mentioned structure, when a logical signal of the high level (first power supply voltage VDD1) is supplied to the input end IN, the output end OUT delivers a logical signal of the low level (ground voltage GND). On the contrary, when a logical signal of the low level (ground voltage GND) is supplied to the input end IN, the output end OUT delivers a logical signal of the high level (second power supply voltage VDD2). In other words, if the control signal E1 is the high level, the inverter INV6' (INV7') reverses a logic level of the logical signal supplied to the input end IN and further raises the high level potential from the first power supply voltage VDD1 to the second power supply voltage VDD2 so as to delivers the signal. On the other hand, if the control signal E1 is the low level (GND), each of the transistors P4 and N5 is turned off, so that the output end OUT becomes a high impedance state. In other words, the inverter INV6' (INV7') can make the output end OUT the high impedance state regardless of the logical signal supplied to the input end IN if the control signal E1 is the low level (GND). Therefore, if the three-state inverters INV6' and INV7' are used, the pass switches SW3 and SW4 illustrated in FIG. 2 can be eliminated.

Figure 9:
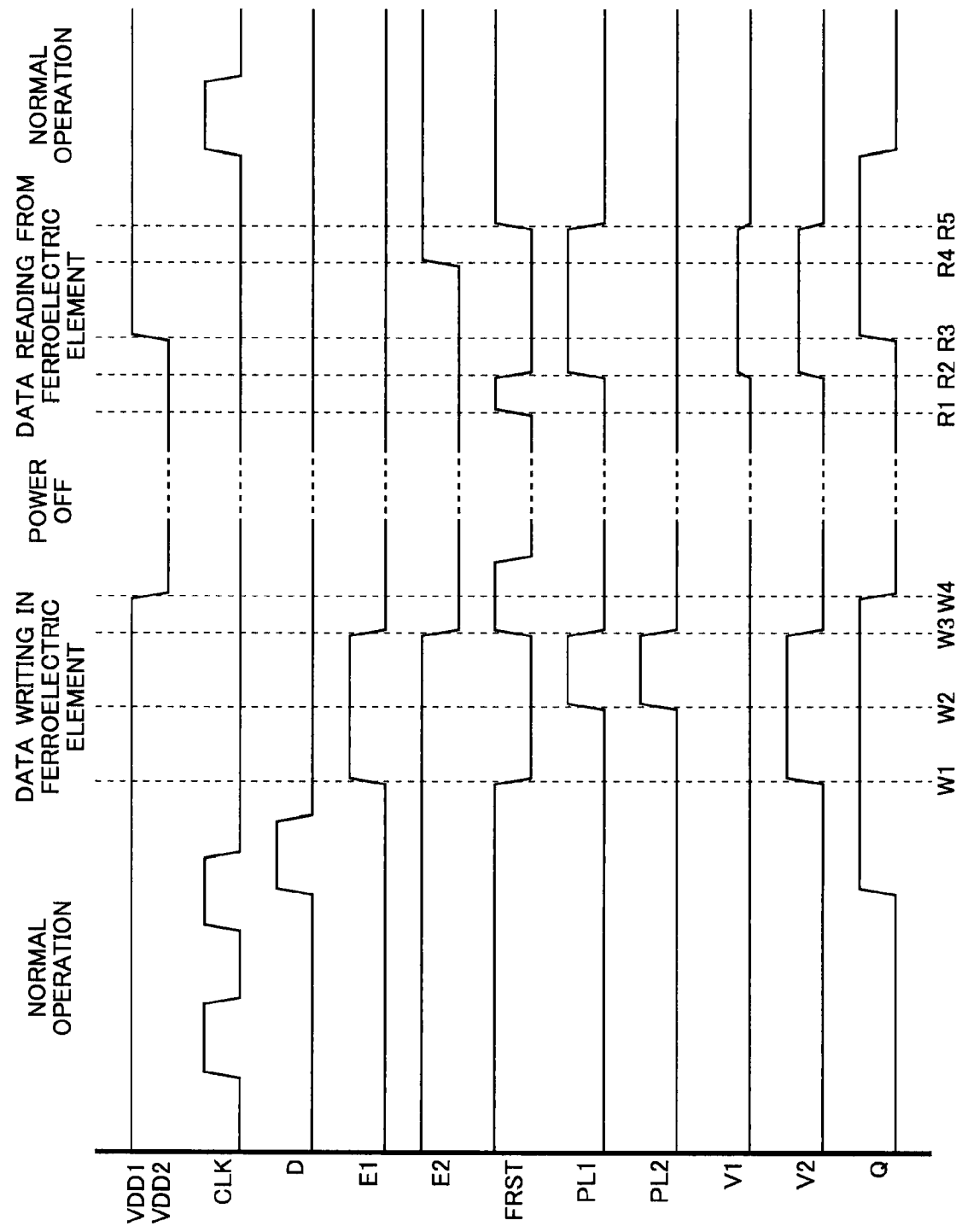
FIG. 9 is a timing chart illustrating another operational example of the data holding device according to the present invention.

Next, a variation example of the data reading action from the ferroelectric element will be described in detail with reference to FIG. 9. FIG. 9 is a timing chart illustrating another operational example of the data holding device according to the present invention, which illustrates voltage waveforms of the power supply voltages (VDD1 and VDD2), the clock signal CLK, the data signal D, the control signal E1, the control signal E2, the F reset signal FRST, the applied voltage of the first plate line PL1, the applied voltage of the second plate line PL2, the node voltage V1, the node voltage V2, and the output signal Q in this order from the top.

During the time points R1 to R5, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data reading action from the ferroelectric element can be enhanced.

At the time point R1, the F reset signal FRST is "1" (VDD2) first, and the transistors Q1a, Q1b, Q2a and Q2b are turned on, so that each of the ferroelectric elements CL1a, CL1b, CL2a and CL2b is short-circuited at the ends. Therefore, no voltage can be applied to the ferroelectric elements CL1a, CL1b, CL2a and CL2b. Even if a voltage fluctuation occurs when the power supply is turned on, no voltage is applied to the ferroelectric elements CL1a, CL1b, CL2a and CL2b without intention, so that changing data can be avoided.

Note that at the time point R1, each of the first plate line PL1 and the second plate line PL2 is "0" (low level of GND).

At the time point R2, the F reset signal FRST becomes "0" (GND), and the transistors Q1a, Q1b, Q2a and Q2b are turned off so as to be the state where a voltage can be applied to the ferroelectric elements CL1a, CL1b, CL2a and CL2b, while the first plate line PL1 becomes "1" (VDD2) in the state where the second plate line PL2 is remained to be "0" (GND). When such the pulse voltages are applied, voltage signals corresponding to the remanent polarization state in the ferroelectric element show up as the node voltage V1 and the node voltage V2.

With reference to the example illustrated in FIG. 9, concrete description will be added as below. WL shows up as the logic level of the node voltage V1, and WH shows up as the logic level of the node voltage V2. In other words, a voltage difference occurs between the node voltage V1 and the node voltage V2 corresponding to a difference of remanent polarization state in the ferroelectric element.

However, the power supply voltage VDD is not yet turned on during the time points R2 to R3, so each of the node voltages V3 to V6 of the individual portions of the loop structure portion LOOP is "0" (GND), thereby the output signal Q is "0" (GND).

At the next time point R3, the first power supply voltage VDD1 is supplied to the loop structure portion LOOP while the second power supply voltage VDD2 is supplied to the nonvolatile storage portion NVM in the state where each of the control signals E1 and E2 is "0" (GND), i.e., in the state where the data write driver is disabled, and the normal loop is disabled in the loop structure portion LOOP. In this case, the signal line indicated by the thick line in FIG. 6 is in the floating state.

Note that during the time points R3 to R4, the control signal E2 becomes "0" (GND) so that the second input ends (0) of the multiplexer MUX1 and the multiplexer MUX2 are selected, and therefore the logic level of the node voltage V3 becomes WL while the logic level of the node voltage V4 becomes WH. In addition, the logic level of the node voltage V5 becomes WH while the logic level of the node voltage V6 becomes WL. In this way, during the time points R3 to R4, the node voltages V1 to V6 of the individual portions of the device are still in an unstable state (the state where the logic level inversion is not completed in the inverter INV3 and the inverter INV4 so that output logic levels thereof are not completely "0" (GND) or "1" (VDD1)).

In the next time point R4, the control signal E2 becomes "1" (VDD1) so that the first input end (1) is selected in the multiplexer MUX1 and the multiplexer MUX2. Therefore, the normal loop is formed in the loop structure portion LOOP. Along with this signal path switching, the output end of the inverter INV4 (having the logic level WH) is connected to the input end of the inverter INV3 (having the logic level WH), and the output end of the inverter INV3 (having the logic level WL) is connected the input end of the inverter INV4 (having the logic level WL). Therefore, no mismatch occurs in the signal logic levels (WH or WL) of the individual nodes. After that, during the period while the normal loop is formed in the loop structure portion LOOP, the inverter INV3 receives the input of the logic level WL and tries to raise the output logic level to "1" (VDD1), while the inverter INV4 receives the input of the logic level WH and tries to lower the output logic level to "0" (GND). As a result, the output logic level of the inverter INV3 is secured to be "0" (GND) from the unstable logic level WL, while the output logic level of the inverter INV4 is secured to be "1" (VDD1) from the unstable logic level WH.

In this way, as the loop structure portion LOOP is made the normal loop at the time point R4, the signal read out from the ferroelectric element (the potential difference between the node voltage V1 and the node voltage V2) is amplified by the loop structure portion LOOP. Thus, the stored data before the power supply is turned off ("1" (VDD1) in the example of FIG. 9) is restored as the output signal Q.

After that, at the time point R5, the F reset signal FRST becomes "1" (VDD2) again so that the transistors Q1a, Q1b, Q2a and Q2b are turned on, and each of the ferroelectric elements CL1a, CL1b, CL2a and CL2b is short-circuited at the ends. Therefore, no voltage can be applied to the ferroelectric elements CL1a, CL1b, CL2a and CL2b. In this case, each of the first plate line PL1 and the second plate line PL2 is "0" (GND). Therefore, the data holding device is reset to the state similar to the state before the time point W1, i.e., to the normal operation state.

As described above, the data reading action in FIG. 9 is different from the data reading action of FIG. 3, and starts to derive the voltage signals (node voltages V1 and V2) corresponding to the remanent polarization state inside the ferroelectric element before the first power supply voltage VDD1 and the second power supply voltage VDD2 are turned on. With this structure, it is possible to reduce operation steps after the first power supply voltage VDD1 and the second power supply voltage VDD2 are turned on (the operational example of FIG. 3 requires three steps (time points R3, R4 and R5) while the operational example of FIG. 9 requires only two steps (time points R4 and R5)), so that time necessary for resetting to the normal operation can be shortened.

Next, characteristics of the ferroelectric element that is used for the data holding device of the present embodiment will be described in detail.

Figure 10:
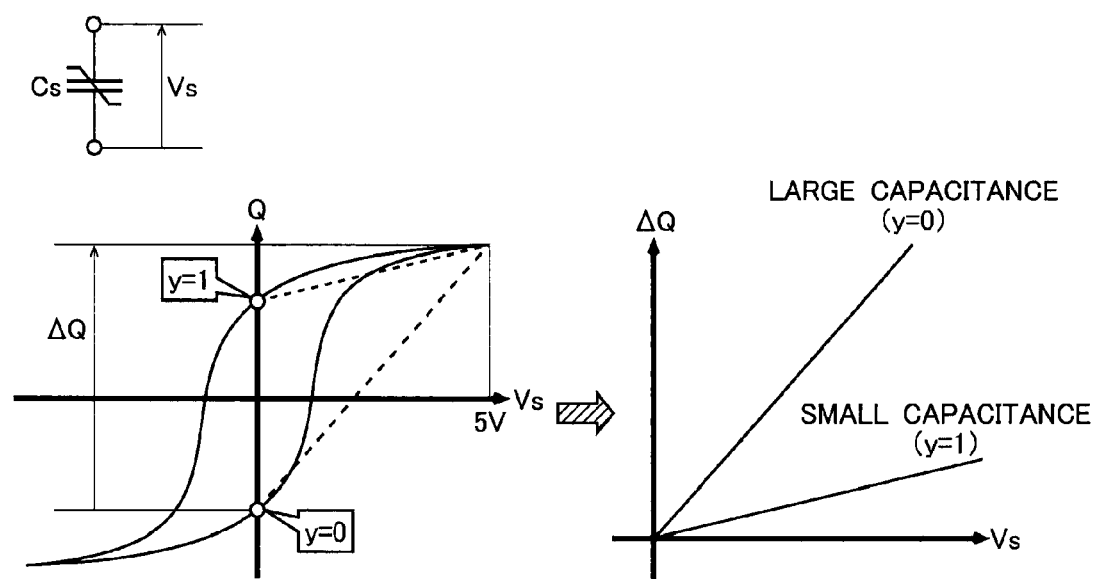
FIG. 10 is a diagram illustrating characteristic of a ferroelectric element.

FIG. 10 is a diagram illustrating characteristics of the ferroelectric element. Note that the upper section in FIG. 10 schematically illustrates a manner of applying the voltage Vs to the ferroelectric element Cs. In addition, the lower left section in FIG. 10 illustrates a hysteresis characteristic of the ferroelectric element Cs, and the lower right section illustrates a capacitance characteristic of the ferroelectric element Cs.

As illustrated in FIG. 10, the ferroelectric element Cs has a capacitance characteristic that changes in accordance with the remanent polarization state when the voltage Vs is applied between ends thereof. Specifically, when the positive voltage Vs is applied between the ends of the ferroelectric element Cs so that the ferroelectric element Cs becomes the non-inverted state (y=1), a capacitance value thereof decreases. On the contrary, when the negative voltage Vs is applied between the ends of the ferroelectric element Cs so that the ferroelectric element Cs becomes the inverted state (y=0), a capacitance value thereof increases. Therefore, in order to read out data stored in the ferroelectric element Cs, it is necessary to convert a difference of the above-mentioned capacitance value into a voltage value.

Therefore, the data holding device of the present embodiment reads out data from the nonvolatile storage portion NVM by using a capacitive coupling between the ferroelectric element in the non-inverted state (y=1) and the ferroelectric element in the inverted state (y=0).

Figure 11:
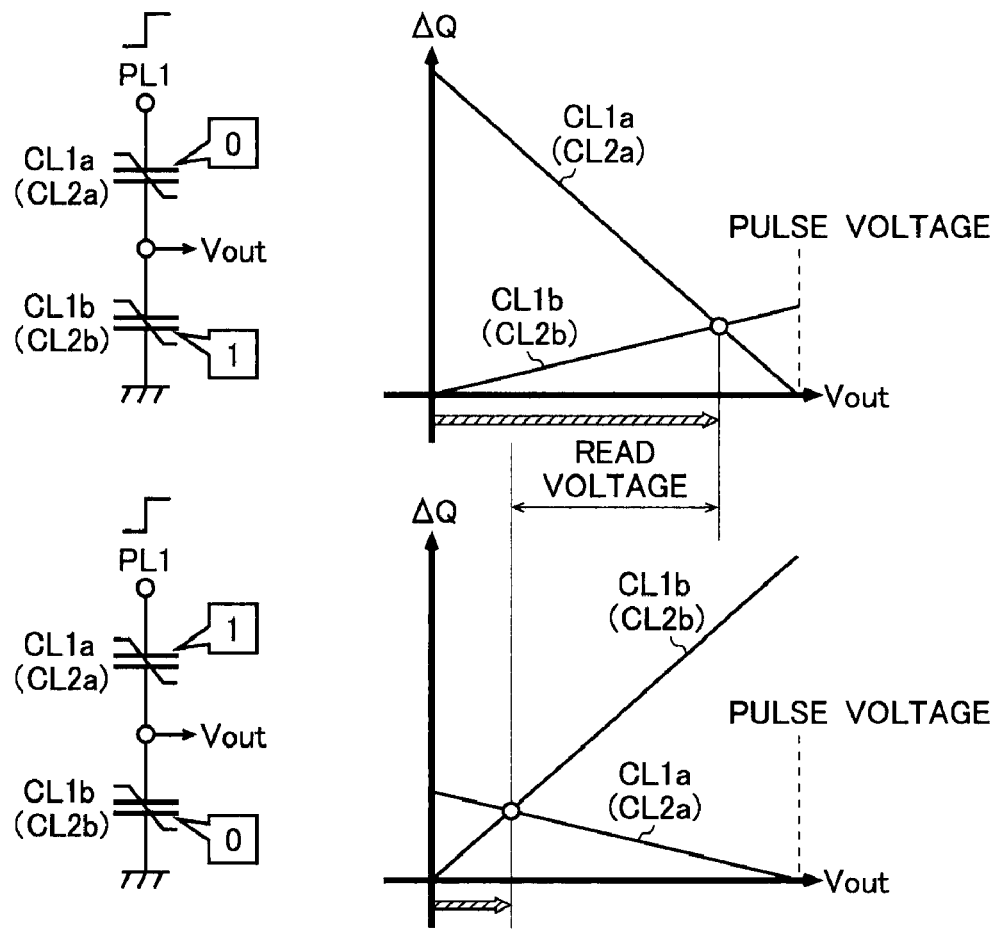
FIG. 11 is a diagram illustrating a data reading method using capacitive coupling between ferroelectric elements.

FIG. 11 is a diagram illustrating a data reading method using the capacitive coupling between the ferroelectric elements. Note that the upper section in FIG. 11 illustrates the capacitance characteristic when the ferroelectric element CL1a (ferroelectric element CL2a) is in the inverted state (y=0) while the ferroelectric element CL1b (ferroelectric element CL2b) is in the non-inverted state (y=1). On the contrary, the lower section in FIG. 11 illustrates the capacitance characteristic when the ferroelectric element CL1a (ferroelectric element CL2a) is in the non-inverted state (y=1) while the ferroelectric element CL1b (ferroelectric element CL2b) is in the inverted state (y=0).

As described above, when data is written in the ferroelectric element, the remanent polarization state becomes opposite between the ferroelectric elements CL1a and CL1b as well as between the ferroelectric elements CL2a and CL2b. Therefore, the capacitance characteristic has the following relationship. The larger one of the capacitance values is, the smaller the other capacitance value is.

Therefore, two ferroelectric elements CL1a and CL1b, as well as ferroelectric elements CL2a and CLK2b having opposite remanent polarization states are connected in series, and a pulse voltage is applied to an end thereof. Then, the node voltages V1 and V2 appearing at the connection nodes between the elements (that is a voltage value determined by a ratio of capacitance values and is referred to as a read-out voltage Vout in FIG. 11) are detected. Thus, a read out margin can be substantially improved with amplitude of the read-out voltage Vout being secured up to near 1 volt.

In addition, the data holding device of the present embodiment compares the node voltage V1 corresponding to a capacitance ratio between the ferroelectric elements CL1a and CL1b with the node voltage Vb corresponding to a capacitance ratio between the ferroelectric elements CL2a and CL2b, so as to perform the 0-1 decision of the data read out from the nonvolatile storage portion NVM. Therefore, it is not necessary to set a threshold value of the inverter exactly.

Figure 12:
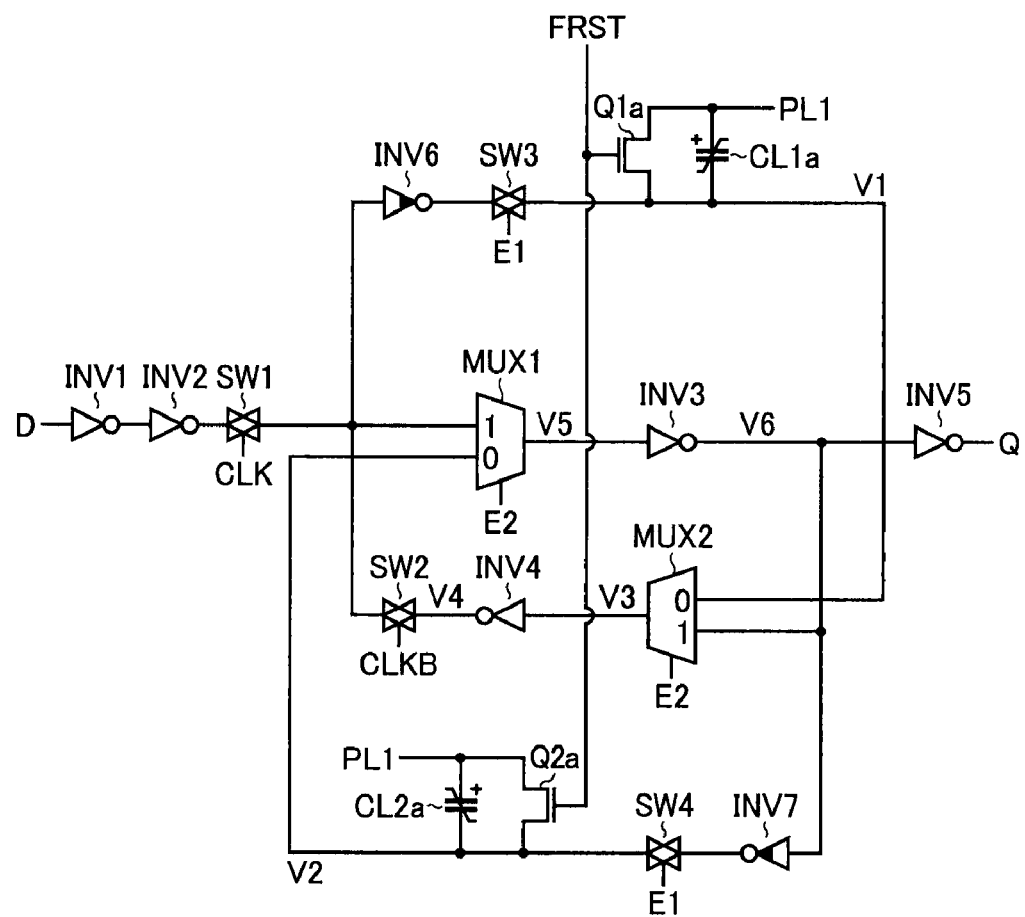
FIG. 12 is a circuit diagram illustrating a second variation example of the data holding device according to the present invention.
Figure 13:
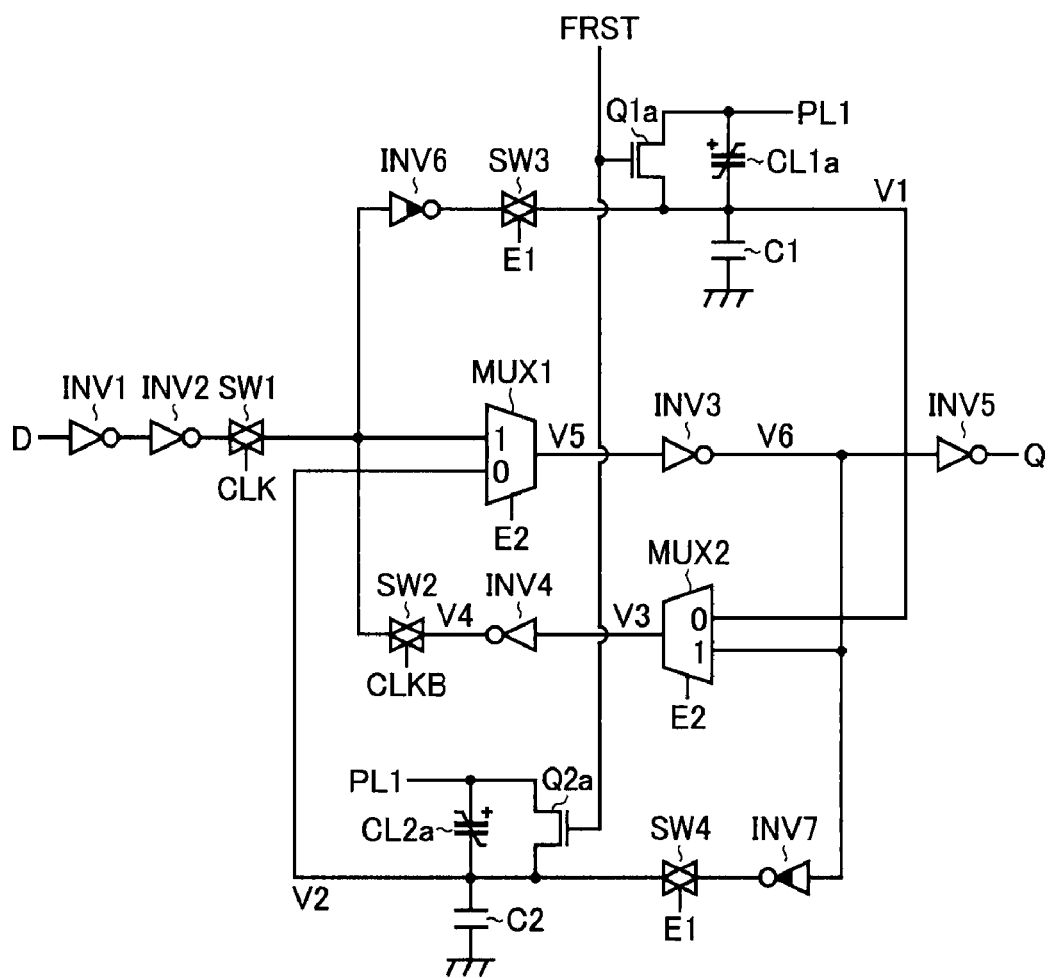
FIG. 13 is a circuit diagram illustrating a third variation example of the data holding device according to the present invention.

In this way, the data holding device of the present embodiment uses the data reading method utilizing the capacitive coupling between the ferroelectric elements, but the present invention is not limited to this structure. It is possible to adopt a structure illustrated in FIG. 12 (second variation example) in which data is read out from the nonvolatile storage portion NVM by utilizing a capacitive coupling between the ferroelectric element CL1a or CL2a and the gate capacitance of the transistor that constitutes the inverter INV3 or INV4 (in other words, the structure obtained by eliminating the ferroelectric elements CL1b and CL2b, and the transistors Q1b and C2b from the structure of FIG. 1). Alternatively, it is possible to adopt a structure illustrated in FIG. 13 (third variation example) in which data is read out from the non-volatile storage portion NVM by utilizing a capacitive coupling between the ferroelectric element CL1a or CL1b and other capacitance element C1 or C2.

Figure 14:
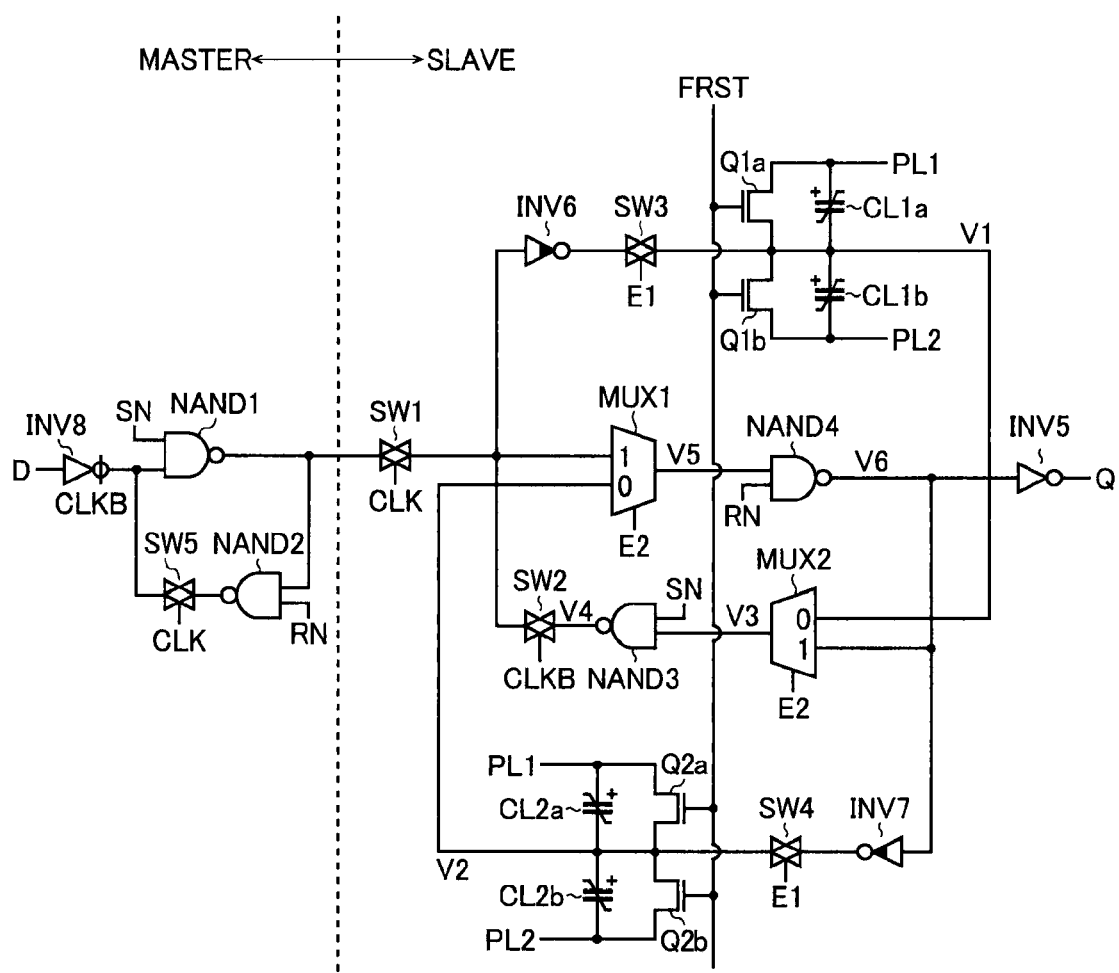
FIG. 14 is a circuit diagram illustrating an application example to a D flip flop.

FIG. 14 is a circuit diagram illustrating an example of an application to a D flip flop (register) having a set/reset function.

As illustrated in FIG. 14, when the D flip flop is constituted, a latch circuit is connected in series to a two-stage set (a master and a slave), but it is not necessary that both the master and the slave are nonvolatile. It is sufficient if the present invention is applied to only the latch circuit on the slave side.

Figure 15:
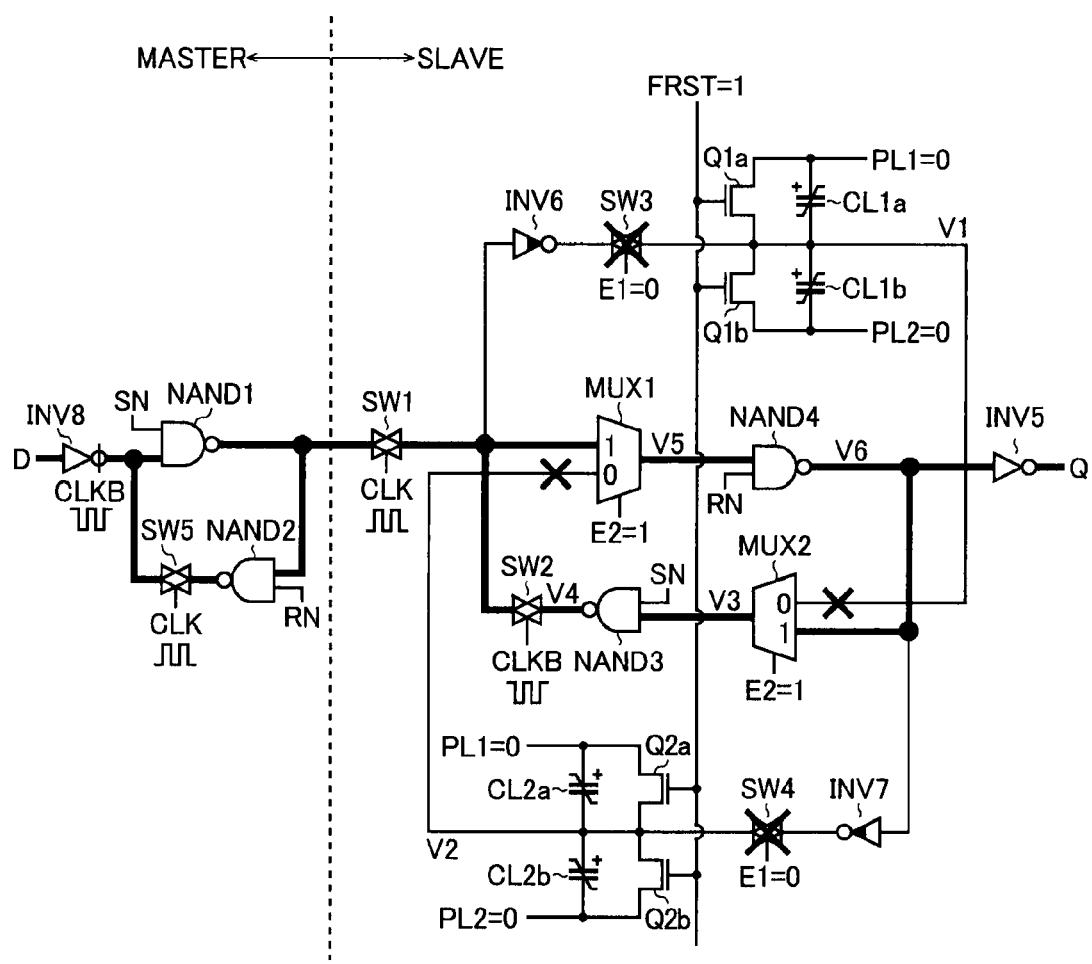
FIG. 15 is a circuit diagram illustrating a signal path in the normal operation.
Figure 16:
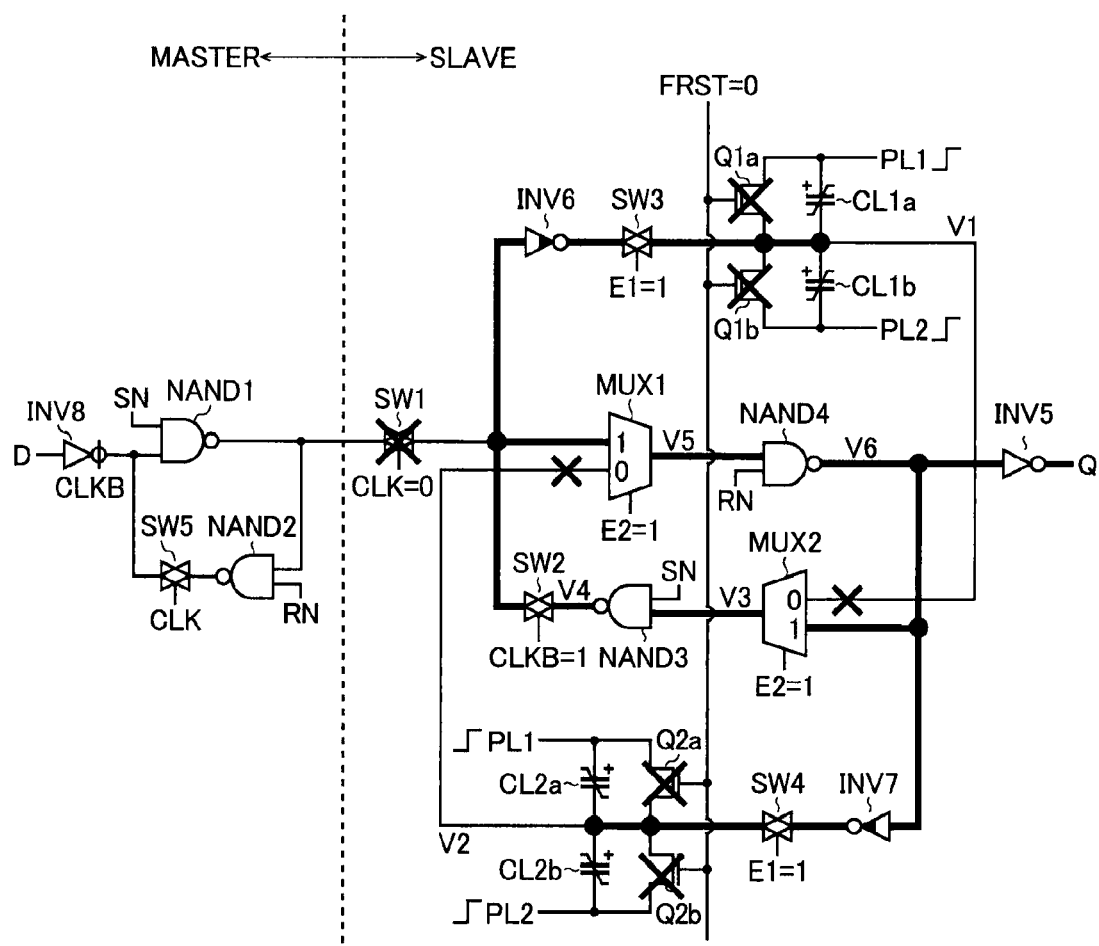
FIG. 16 is a circuit diagram illustrating a signal path in the data writing action.
Figure 17:
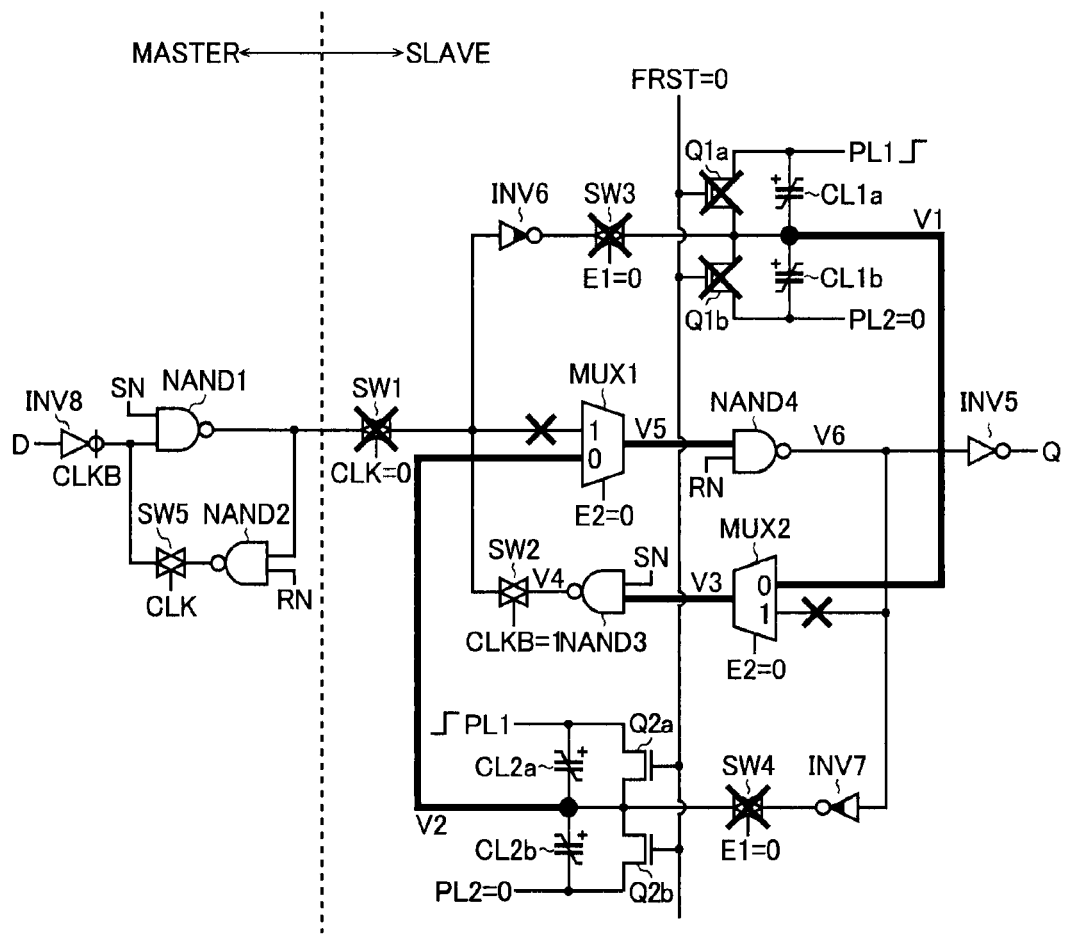
FIG. 17 is a circuit diagram illustrating a signal path in the data reading action.

In addition, the normal operation, the data writing action in the ferroelectric element, and the data reading action from the ferroelectric element are the same as described above except that the latch circuit on the master side is connected. The signal path in each operation also does not specially require overlapping description as illustrated in FIGS. 15 to 17.

However, the D flip flop illustrated in FIG. 14 uses not the inverters but the NOT-AND circuits NAND1 to NAND4 as the logic gates forming the loop structure portion so as to realize the set/reset function. Note that if a set signal RN supplied to the NOT-AND circuits NAND1 and NAND3 is "0" (GND), the output signal Q is forced to be "1" (VDD1). If a reset signal SN supplied to the NOT-AND circuits NAND2 and NAND4 is "0" (GND), the output signal Q is forced to be "0" (GND). Therefore, the set signal RN and the reset signal SN are required to be "1" (VDD1) when data is written or read.

Figure 18:
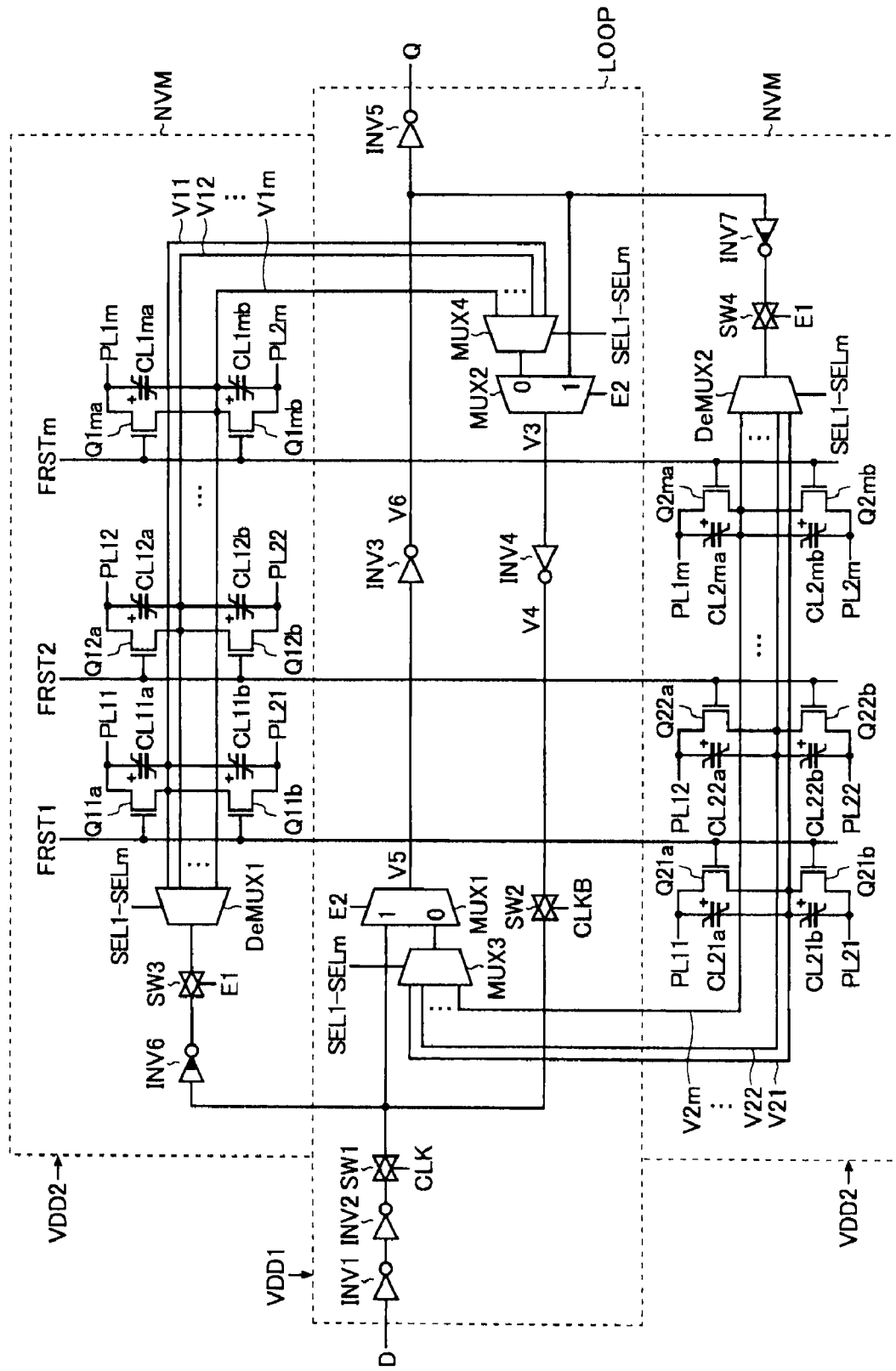
FIG. 18 is a circuit diagram illustrating a fourth variation example of the data holding device according to the present invention.

Next, a fourth variation example of the data holding device according to the present invention will be described in detail with reference to FIG. 18. FIG. 18 is a circuit diagram illustrating a fourth variation example of the data holding device according to the present invention.

The data holding device illustrated in FIG. 18 is a latch circuit including inverters INV1 to INV7, pass switches SW1 to SW4, multiplexers MUX1 to MUX4, demultiplexers DeMUX1 and DeMUX2, N-channel field-effective transistors Q11a-Q1ma, Q11b-Q1mb, Q21a-Q2ma, and Q21b-Q2mb, and ferroelectric elements (ferroelectric capacitors) CL11a-CL1ma, CL11b-CL1mb, CL21a-CL2ma, and CL21b-CL2mb.

An input end of the inverter INV1 is connected to a receiving end of the data signal (D). An output end of the inverter INV1 is connected to an input end of the inverter INV2. An output end of the inverter INV2 is connected to a first input end (1) of the multiplexer MUX1 via the pass switch SW1. An output end of the multiplexer MUX1 is connected to an input end of the inverter INV3. An output end of the inverter INV3 is connected to an input end of the inverter INV5. An output end of the inverter INV5 is connected to an outlet end of the output signal (Q). The first input end (1) of the multiplexer MUX2 is connected to the output end of the inverter INV3. An output end of the multiplexer MUX2 is connected to an input end of the inverter INV4. An output end of the inverter INV4 is connected to the first input end (1) of the multiplexer MUX1 via the pass switch SW2.

In this way, the data holding device of the present embodiment includes the loop structure portion LOOP that uses the two logic gate connected like a loop (inverters INV3 and INV4 in FIG. 18) so as to hold the input data signal D.

Note that the loop structure portion LOOP is driven by being supplied with the first power supply voltage VDD1 (e.g., 0.6 volts).

An input end of the inverter INV6 is connected to the first input end (1) of the multiplexer MUX1. An output end of the inverter INV6 is connected to an input end of the demultiplexer DeMUX1 via the pass switch SW3. A first output end to an m-th output end of the demultiplexer DeMUX1 are connected to a first input end to an m-th input end of the multiplexer MUX4, respectively. An output end of the multiplexer MUX4 is connected to a second input end (0) of the multiplexer MUX2.

An input end of the inverter INV7 is connected to the first input end (1) of the multiplexer MUX2. An output end of the inverter INV7 is connected to an input end of the demultiplexer DeMUX2 of the pass switch SW4. A first output end to an m-th output end of the demultiplexer DeMUX2 are connected to a first input end to an m-th input end of the multiplexer MUX3, respectively. The output end of the multiplexer MUX3 is connected to a second input end (0) of the multiplexer MUX1.

Positive ends of the ferroelectric elements CL11a-CL1ma are connected to plate lines PL11-PL1m, respectively. Negative ends of the ferroelectric elements CL11a-CL1ma are connected to a first output end to an m-th output end of the demultiplexer DeMUX1, respectively. The transistors Q11a-Q1ma are connected between the ends of the ferroelectric elements CL11a to 1ma, respectively. Gates of the transistors Q11a-Q1ma are connected to receiving ends of F reset signals FRST1-FRSTm, respectively.

Positive ends of the ferroelectric elements CL11b-CL1mb are connected to a first output end to an m-th output end of the demultiplexer DeMUX1, respectively. Negative ends of the ferroelectric elements CL11b-CL1mb are connected to plate lines PL21-PL2m, respectively. The transistors Q11b-Q1mb are connected between the ends of the ferroelectric elements CL11b-CL1mb, respectively. Gates of the transistors Q11b-Q1mb are connected to receiving ends of the F reset signals FRST1-FRSTm, respectively.

Positive ends of the ferroelectric elements CL21a-CL2ma are connected to plate lines PL11-PL1m, respectively. Negative ends of the ferroelectric elements CL21a-CL2ma are connected to a first output end to an m-th output end of the demultiplexer DeMUX2, respectively. The transistors Q21a-Q2ma are connected between the ends of the ferroelectric elements CL21a-CL2ma, respectively. Gate of the transistors Q21a-Q2ma are connected to receiving ends of the F reset signals FRST1-FRSTm, respectively.

Positive ends of the ferroelectric elements CL21b-CL2mb are connected to a first output end to an m-th output end of the demultiplexer DeMUX2, respectively. Negative ends of the ferroelectric elements CL21b-CL2mb are connected to the plate lines PL21-PL2m, respectively. The transistors Q21b-Q2mb are connected between the ends of the ferroelectric elements CL21b-CL2mb, respectively. Gates of the transistors Q21b-Q2mb are connected to receiving ends of the F reset signals FRST1-FRSTm, respectively.

As described above, the data holding device of the present embodiment includes the nonvolatile storage portion NVM that uses hysteresis characteristics of the ferroelectric elements (CL11a-CL1ma, CL11b-CL1mb, CL21a-CL2ma, and CL21b-CL2mb) so as to store the data D held in the loop structure portion LOOP, in a nonvolatile manner.

Note that the nonvolatile storage portion NVM is driven by being supplied with a second power supply voltage VDD2 (e.g., 1.2 volts) that is higher than the first power supply voltage VDD1.

In addition, among the structural elements described above, the pass switch SW1 is turned on and off in accordance with the clock signal CLK while the pass switch SW2 is turned on and off in accordance with the reverse clock signal CLKB (logical inversion signal of the clock signal CLK). In other words, the pass switch SW1 and the pass switch SW2 are turned on and off in an exclusive (complementary) manner to each other.

On the other hand, each of the pass switches SW3 and SW4 is turned on and off in accordance with the control signal E1. In addition, each of the multiplexers MUX1 and MUX2 is switched between the signal paths in accordance with the control signal E2. In addition, each of the multiplexers MUX3 and MUX4 and the demultiplexers DeMUX1 and DeMUX2 is switched between the signal paths in accordance with the control signals SEL1-SELm. In other words, in the data holding device of the present embodiment, the multiplexers MUX1 to MUX4, the demultiplexers DeMUX1 and DeMUX2, the inverters INV6 and INV7, and the pass switches SW3 and SW4 function as the circuit separating portion SEP for electrically separating the loop structure portion LOOP from the nonvolatile storage portion NVM.

Note that among the circuit elements forming the circuit separating portion SEP, the multiplexers MUX1 to MUX4 included in the loop structure portion LOOP is driven by being supplied with the first power supply voltage VDD1, and the demultiplexers DeMUX1 and DeMUX2, and the pass switches SW3 and SW4 included in the nonvolatile storage portion NVM are driven by being supplied with the second power supply voltage VDD2.

In addition, the inverters INV6 and INV7 are driven by being supplied with both the first power supply voltage VDD1 and the second power supply voltage VDD2, and have a function as a level shifter for converting a voltage level of the data D communicated between the loop structure portion LOOP and the nonvolatile storage portion NVM. Note that the circuit structure of the inverters INV6 and INV7 is already described, so overlapping description will be omitted. In addition, as illustrated in FIG. 7, the three-state inverters INV6' and INV7' may be used instead of the inverter INV6, the pass switch SW3, the inverter INV7 and the pass switch SW4.

In this way, the data holding device having the above-mentioned structure is extended from the structure illustrated in FIG. 1 so that the data D is stored only by m bits (m≧2), and includes a first storage area to an m-th storage area that can be selected in accordance with control signals SEL1-SELm. Note that the description will be added below with reference to the example illustrated in FIG. 18. An x-th storage area (1≦x≦m) is formed of ferroelectric elements CL1xa, CL1xb, CL2xa and CL2xb, and transistors Q1xa, Q1xb, Q2xa and Q2xb. However, the present invention is not limited to this structure, and it is also possible to make modification similarly to FIG. 12 or 13.

Next, an operation of the data holding device having the above-mentioned structure will be described in detail. Note that in the following description, node voltages at individual portions are denoted as below. Voltages that appear at a first output end to an m-th output end of the demultiplexer DeMUX1 (a first input end to an m-th input end of the multiplexer MUX4) are denoted by V11 to V1m, voltages that appear at a first output end to an m-th output end of the demultiplexer DeMUX2 (a first input end to an m-th input end of the multiplexer MUX3) are denoted by V21 to V2m, a voltage that appears at an input end of the inverter INV4 is denoted by V3, a voltage that appears at an output end of the inverter INV4 is denoted by V4, a voltage that appears at an input end of the inverter INV3 is denoted by V5, and a voltage that appears at an output end of the inverter INV3 is denoted by V6.

Figure 19:
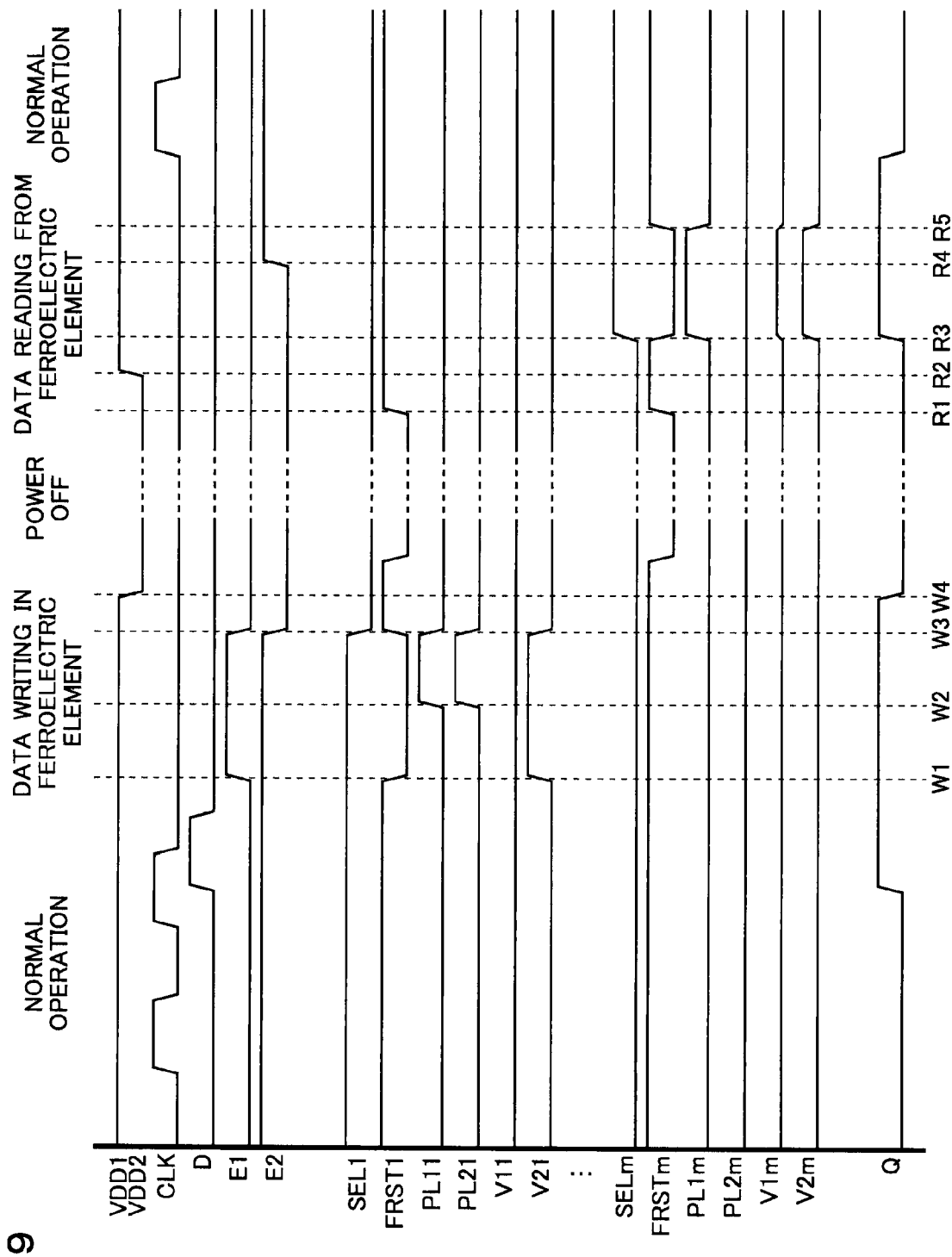
FIG. 19 is a timing chart illustrating an operational example of the data holding device according to the present invention.

FIG. 19 is a timing chart illustrating an operational example of the data holding device according to the present invention (an operation of writing the data D in the first storage area and reading out the data D from the m-th storage area), and illustrates voltage waveforms of the power supply voltages (VDD1 and VDD2), the clock signal CLK, the data signal D, the control signal E1, the control signal E2, the control signal SEL1, the F reset signal FRST1, the applied voltage of the plate line PL11, the applied voltage of the plate line PL21, the node voltage V11, the node voltage V21, the control signal SELm, the F reset signal FRSTm, the applied voltage of the plate line PL1m, the applied voltage of the plate line PL2m, the node voltage V1m, the node voltage V2m, and the output signal Q in this order from the top.

Note that the control signal SELy, the F reset signal FRSTy, the applied voltage of the plate line PL1y, the applied voltage of the plate line PL2y, the node voltage V1y, and the node voltage V2y concerning a y-th storage area (1<y<m) that is not selected as a write destination or a read source of the data D are the same as those of the m-th storage area that is not selected as a write destination of the data D during the writing action of the data D, and are the same as those of the first storage area that is not selected as a read source of the data D during the reading action of the data D. Therefore, illustration and description thereof will be omitted appropriately.

First, the normal operation of the data holding device will be described.

Until the time point W1, the F reset signals FRST1-FRSTm are all "1" (high level of VDD2), and transistors Q11a-Q1ma, Q11b-Q1mb, Q21a-Q2ma, and Q21b-Q2mb are all turned on, so that each of the ferroelectric elements CL11a-CL1ma, CL11b-CL1mb, CL21a-CL2ma, and CL21b-CL2mb is short-circuited at the ends. Therefore, no voltage can be applied to the ferroelectric elements CL11a-CL1ma, CL11b-CL1mb, CL21a-CL2ma, and CL21b-CL2mb. Note that each of the plate lines PL11-PL1m and the plate lines PL21-PL2m is "0" (low level of GND).

In addition, until the time point W1, the control signal E1 is "0", so that the pass switch SW3 and the pass switch SW4 are turned off. Therefore, the data write drivers (inverters INV6 and INV7 in the example of FIG. 18) are both disabled.

In addition, until the time point W1, the control signal E2 is "1" (VDD1), so that the first input ends (1) of the multiplexer MUX1 and the multiplexer MUX2 are selected. Therefore, the normal loop is formed in the loop structure portion LOOP.

Therefore, during the high level period of the clock signal CLK, the pass switch SW1 is turned on while the pass switch SW2 is turned off, so that the data signal D becomes the output signal Q as it is. On the other hand, during the low level period of the clock signal CLK, the pass switch SW1 is turned off while the pass switch SW2 is turned on. Therefore, the data signal D is latched at the trailing edge of the clock signal CLK.

Next, the data writing action in the first storage area will be described.

During the time points W1 to W3, the clock signal CLK is "0" (GND) while the reverse clock signal CLKB is "1" (VDD1). Therefore, the first pass switch SW1 is turned off while the second pass switch is turned on. In this way, logic levels of the clock signal CLK and the reverse clock signal CLKB are fixed in advance, so that stability of the data writing action in the ferroelectric element can be enhanced.

In addition, during the time points W1 to W3, the control signal SEL1 is "1" (VDD2) while the other control signals SEL2 to SELm are "0" (GND) so as to select the first storage area as the write destination of the data D. Thus, the demultiplexers DeMUX1 and DeMUX2 become the state where the signal path connecting the input end and the first output end is selected, while the multiplexers MUX3 and MUX4 become the state where the signal path connecting the output end and the first input end is selected.

In addition, during the time points W1 to W3, the F reset signal FRST1 is "0" (GND) so that the transistors Q11a, Q11b, Q21a and Q21b are turned off. Therefore, a voltage can be applied to the ferroelectric elements CL11a, CL11b, CL21a and CL21b.

On the other hand, the F reset signals FRST2 to FRSTm are kept to be "1" (VDD2), so that changing data can be avoided in the second storage area to the m-th storage area.

In addition, during the time points W1 to W3, the control signal E1 is "1" (VDD2) so that the pass switch SW3 and the pass switch SW4 are turned on. Therefore, each of the data write drivers (inverters INV6 and INV7 in the example of FIG. 18) is enabled.

Note that during the time points W1 to W3, the control signal E2 is "1" (VDD1) in the same manner as before, so that the first input ends (1) of the multiplexer MUX1 and the multiplexer MUX2 are selected. Therefore, the normal loop is formed in the loop structure portion LOOP.

In addition, the plate lines PL11 and PL21 are "0" (GND) during the time points W1 to W2, and the plate lines PL11 and PL21 are "1" (VDD2) during the time points W2 to W3. In other words, the same pulse voltage is applied to the plate lines PL11 and PL21. By such the application of the pulse voltage, the remanent polarization state inside the ferroelectric element is set to either the inverted state or the non-inverted state.

Specific description will be added as below with reference to the example of FIG. 19. The output signal Q is "1" (VDD1) at the time point W1, so the node voltage V11 becomes "0" (GND) while the node voltage V21 becomes "1" (VDD1). Therefore, during the time points W1 to W2, while the plate lines PL11 and PL21 are both "0" (GND), no voltage is applied between the ends of the ferroelectric elements CL11a and CL11b. A negative voltage is applied between the ends of the ferroelectric element CL21a, and a positive voltage is applied between the ends of the ferroelectric element CL21b. On the other hand, during the time points W2 to W3, while the plate lines PL11 and PL21 are both "1" (VDD2), no voltage is applied between the ends of the ferroelectric elements CL21a and CL21b. A positive voltage is applied between the ends of the ferroelectric element CL11a, and a negative voltage is applied between the ends of the ferroelectric element CL11b.

In this way, when the pulse voltage is applied to the plate lines PL11 and PL21, the remanent polarization state inside the ferroelectric element is set to either the inverted state or the non-inverted state. Note that the remanent polarization state becomes opposite between the ferroelectric elements CL11a and CL11b as well as between the ferroelectric elements CL21a and CL21b. In addition, the remanent polarization state becomes opposite also between the ferroelectric elements CL11a and CL21a as well as between the ferroelectric elements CL11b and CL21b.

Note that during the time points W1 to W3, each of the plate lines PL12 to PL1m and PL22 to PL2m is kept to be "0" (GND).

At the time point W3, the F reset signal FRST1 becomes "1" (VDD2) again, so that the transistors Q11a, Q11b, Q21a and Q21b are turned on, and each of the ferroelectric elements CL11a, CL11b, CL21a and CL21b is short-circuited at the ends. Therefore, no voltage can be applied to the ferroelectric elements CL11a, CL11b, CL21a and CL21b. In this case, each of the plate lines PL11 and PL21 is "0" (GND). In addition, the control signal SEL1 is also "0" (GND).

In addition, at the time point W3, the control signal E1 becomes "0" (GND) again, so that the pass switch SW3 and the pass switch SW4 are turned off. Therefore, each of the data write drivers (inverters INV6 and INV7 in the example of FIG. 18) is disabled. Note that the control signal E2 is not minded but is "0" (GND) in the example of FIG. 19.

In addition, at the time point W3, the F reset signals FRST2-FRSTm are all kept to be "1" (VDD2), and the control signals SEL2-SELm, the plate lines PL12-PL1m and PL22-PL2m are all kept to be "0" (GND).

Further, at the time point W4, supply of the first power supply voltage VDD1 to the loop structure portion LOOP and supply of the second power supply voltage VDD2 to the nonvolatile storage portion NVM are both interrupted. In this case, the F reset signals FRST1-FRSTm are all kept to be "1" (VDD2) from the time before the first power supply voltage VDD1 and the second power supply voltage VDD2 are cut off. The transistors Q11a-Q1ma, Q11b-Q1mb, Q21a-Q2ma and Q21b-Q2mb are turned on, so that each of the ferroelectric elements CL11a-CL1ma, CL11b-CL1mb, CL21a-CL2ma and CL21b-CL2mb is short-circuited at the ends. Therefore, no voltage can be applied to the ferroelectric elements CL11a-CL1ma, CL11b-CL1mb, CL21a-CL2ma and CL21b-CL2mb. Even if a voltage fluctuation occurs when the power supply is interrupted, no voltage is applied to the ferroelectric elements CL11a-CL1ma, CL11b-CL1mb, CL21a-CL2ma and CL21b-CL2mb without intention, so that changing data can be avoided.

Next, the data reading action from the m-th storage area will be described.

During the time points R1 to R5, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data reading action from the ferroelectric element can be enhanced.

At the time point R1, all the F reset signals FRST1-FRSTm are "1" (VDD2) first, and the transistors Q11a-Q1ma, Q11b-Q1mb, Q21a-Q2ma and Q21b-Q2mb are turned on, so that each of the ferroelectric elements CL11a-CL1ma, CL11b-CL1mb, CL21a-CL2ma and CL21b-CL2mb is short-circuited at the ends. Therefore, no voltage can be applied to the ferroelectric elements CL11a-CL1ma, CL11b-CL1mb, CL21a-CL2ma and CL21b-CL2mb. Even if a voltage fluctuation occurs when the power supply is turned on, no voltage is applied to the ferroelectric elements CL11a-CL1ma, CL11b-CL1mb, CL21a-CL2ma and CL21b-CL2mb without intention, so that changing data can be avoided.

Note that at the time point R1, each of the plate lines PL11-PL1m and the plate lines PL21-PL2m is "0" (low level of GND).

At the time point R2, in the state where each of the control signals E1 and E2 is "0" (GND) (i.e., in the state where the data write drivers are disabled and the normal loop is disabled in the loop structure portion LOOP), the first power supply voltage VDD1 for the loop structure portion LOOP and the second power supply voltage VDD2 for the nonvolatile storage portion NVM are turned on.

At the next time point R3, the control signal SELm is "1" (VDD2), and other control signals SEL1 to SEL(m−1) are "0" (GND) so as to select the m-th storage area as the read source of the data D. Thus, the demultiplexers DeMUX1 and DeMUX2 are in the state where the signal path connecting the input end and the m-th output end is selected, while the multiplexers MUX3 and MUX4 are in the state where the signal path connecting the output end and the m-th input end is selected.

In addition, at the time point R3, the F reset signal FRSTm becomes "0" (GND), so that the transistors Q1ma, Q1mb, Q2ma and Q2mb are turned off. Therefore, a voltage can be applied to the ferroelectric elements CL1ma, CL1mb, CL2ma and CL2mb, and the plate line PL1m becomes "1" (VDD2) while the plate line PL2m is kept to be "0" (GND). By such the application of the pulse voltage, voltage signals corresponding to the remanent polarization state inside the ferroelectric element appear as the node voltage V1m and the node voltage V2m.

With reference to an example of FIG. 19 (in the case where the data D of the logic level "1" is stored in the third storage area), concrete description will be given below. WL appears as a logic level of the node voltage V1m while WH appears as a logic level of the node voltage V2m. In other words, a voltage difference corresponding to a difference of the remanent polarization state in the ferroelectric element occurs between the node voltage V1m and the node voltage V2m.

In this case, during the time points R3 to R4, the control signal E2 is "0" (GND), and the second input ends (0) of the multiplexer MUX1 and the multiplexer MUX2 are selected. Therefore, the logic level of the node voltage V3 becomes WL while the logic level of the node voltage V4 becomes WH. In addition, the logic level of the node voltage V5 becomes WH while the logic level of the node voltage V6 becomes WL. In this way, during the time points R3 to R4, the node voltages V1m, V2m, and V3 to V6 of the individual portions of the device are still unstable state (the state where the logic level inversion is not completed in the inverter INV3 and the inverter INV4 so that output logic levels thereof are not completely "0" (GND) or "1" (VDD1)).

Note that at the time point R3, each of the F reset signals FRST1 to FRST(m−1) is kept to be "1" (VDD2), so that the control signals SEL1 to SEL(m−1) and plate lines PL11 to PL1(m−1) and PL21 to PL2(m−1) are all kept to be "0" (GND).

At the next time point R4, the control signal E2 becomes "1" (VDD1) so that the first input ends (1) of the multiplexer MUX1 and the multiplexer MUX2 are selected, and the normal loop is formed in the loop structure portion LOOP. When the signal path is switched in this way, the output end of the inverter INV4 (having the logic level of WH) is connected to the input end of the inverter INV3 (having the logic level of WH), and the output end of the inverter INV3 (having the logic level of WL) is connected to the input end of the inverter INV4 (having the logic level of WL). Therefore, no mismatch occurs in the signal logic level (WH or WL) of each node. After that, during the period while the normal loop is formed in the loop structure portion LOOP, the inverter INV3 receives the input of the logic level WL and tries to raise the output logic level to "1" (VDD1) while the inverter INV4 receives the input of the logic level WH and tries to lower the output logic level to "0" (GND). As a result, the output logic level of the inverter INV3 is secured to be "0" (GND) from the unstable logic level WL, and the output logic level of the inverter INV4 is secured to be "1" (VDD1) from the unstable logic level WH.

In this way, at the time point R4, as the loop structure portion LOOP becomes the normal loop, the signal read out from the ferroelectric element (potential difference between the node voltage V1m and the node voltage V2m) is amplified by the loop structure portion LOOP. Thus, the stored data in the third storage area ("1" (VDD1) in the example of FIG. 19) is restored as the output signal Q.

After that, at the time point R5, the F reset signal FRSTm becomes "1" (VDD2) again, so that the transistors Q1ma, Q1mb, Q2ma and Q2mb are turned on. Therefore, each of the ferroelectric elements CL1ma, CL1mb, CL2ma and CL2mb is short-circuited at the ends, so that no voltage can be applied to the ferroelectric elements CL1ma, CL1mb, CL2ma and CL2mb. In this case, each of the plate line PL1m and the plate line PL2m is "0" (GND). Therefore, the data holding device is reset to be the normal operation state that is the same as the state before the time point W1.

As described above, in the data holding device of the third variation example, the nonvolatile storage portion NVM for storing the data D held in the loop structure portion LOOP in a nonvolatile manner by using the hysteresis characteristic of the ferroelectric element includes m storage areas that uses the ferroelectric element and selects an storage area for use to be a write destination or a read source of the data D in accordance with the predetermined control signals SEL1-SELm. With such the structure, it is possible to realize the data holding device that is capable of switching a plurality of data D arbitrarily for use.

Note that the ferroelectric element is separated from the signal line in the normal operation of the data holding device, so a deterioration of performance (such as a decrease of speed or an increase of power consumption) of the data holding device is not caused by the increase of ferroelectric elements.

Figure 20:
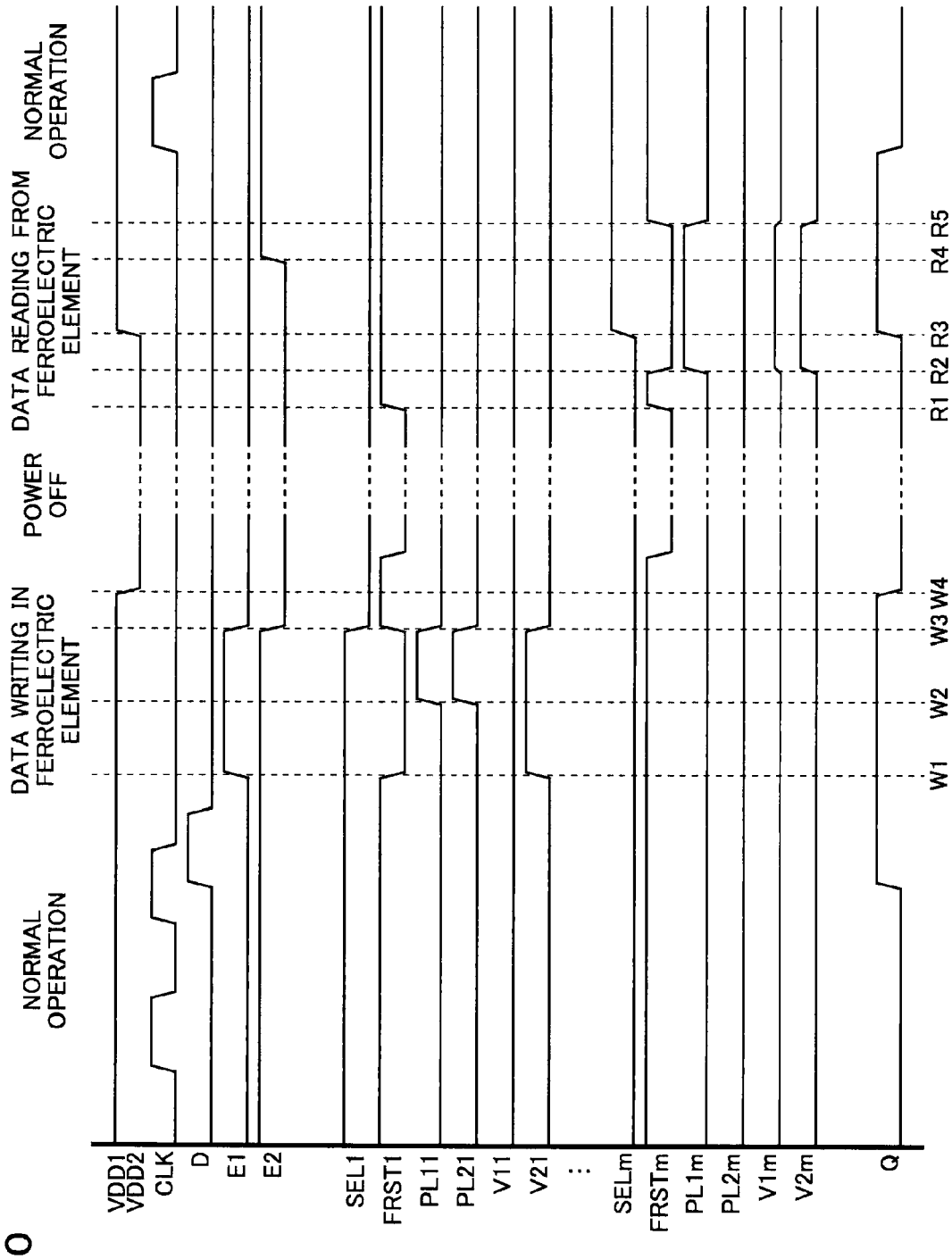
FIG. 20 is a timing chart illustrating another operational example of the data holding device according to the present invention.

Next, a variation example of the data reading action from the third storage area will be described in detail with reference to FIG. 20. FIG. 20 is a timing chart illustrating another operational example of the data holding device according to the present invention, in which voltage waveforms of the power supply voltages (VDD1 and VDD2), the clock signal CLK, the data signal D, the control signal E1, the control signal E2, the control signal SEL1, the F reset signal FRST1, the applied voltage of the plate line PL11, the applied voltage of the plate line PL21, the node voltage V11, the node voltage V21, the control signal SELm, the F reset signal FRSTm, the applied voltage of the plate line PL1m, the applied voltage of the plate line PL2m, the node voltage V1m, the node voltage V2m and the output signal Q are illustrated in this order from the top.

Note that the control signal SELy, the F reset signal FRSTy, the applied voltage of the plate line PL1y, the applied voltage of the plate line PL2y, the node voltage V1y, and the node voltage V2y concerning a y-th storage area (1<y<m) that is not selected as a write destination or a read source of the data D are the same as those of the m-th storage area that is not selected as a write destination of the data D during the writing action of the data D, and are the same as those of the first storage area that is not selected as a read source of the data D during the reading action of the data D. Therefore, illustration and description thereof will be omitted appropriately.

During the time points R1 to R5, the clock signal CLK is "0" (GND), and the reverse clock signal CLKB is "1" (VDD1). Therefore, the first pass switch SW1 is turned off, and the second pass switch is turned on. In this way, logic levels of the clock signal CLK and the reverse clock signal CLKB are fixed in advance, so that stability of the data reading action from the ferroelectric element can be enhanced.

At the time point R1, the F reset signals FRST1-FRSTm are "1" (VDD2) first, and the transistors Q11a-Q1ma, Q11b-Q1mb, Q21a-Q2ma and Q21b-Q2mb are turned on, so that each of the ferroelectric elements CL11a-CL1ma, CL11b-CL1mb, CL21a-CL2ma and CL21b-CL2mb is short-circuited at the ends. Therefore, no voltage can be applied to the ferroelectric elements CL11a-CL1ma, CL11b-CL1mb, CL21a-CL2ma and CL21b-CL2mb. Even if a voltage fluctuation occurs when the power supply is turned on, no voltage is applied to the ferroelectric elements CL11a-CL1ma, CL11b-CL1mb, CL21a-CL2ma and CL21b-CL2mb without intention, so that changing data can be avoided.

Note that at the time point R1, each of the plate lines PL11-PL1m and the plate lines PL21-PL2m is "0" (low level of GND).

At the time point R2, the F reset signal FRSTm becomes "0" (GND) so that the transistors Q1ma, Q1mb, Q2ma and Q2mb are turned off, and a voltage can be applied to the ferroelectric elements CL1ma, CL1mb, CL2ma and CL2mb. On the other hand, the plate line PL1m becomes "1" (VDD2) while the plate line PL2m is kept to be "0" (GND). By such the application of the pulse voltage, voltage signals corresponding to the remanent polarization state inside the ferroelectric element appear as the node voltage V1m and the node voltage V2m.

With reference to an example of FIG. 20 (in the case where the data D of the logic level "1" is stored in the third storage area), concrete description will be given below. WL appears as a logic level of the node voltage V1m while WH appears as a logic level of the node voltage V2m. In other words, a voltage difference corresponding to a difference of the remanent polarization state in the ferroelectric element occurs between the node voltage V1m and the node voltage V2m.

However, the first power supply voltage VDD1 is not yet turned on during the time points R2 to R3, so each of the node voltages V3 to V6 of the individual portions of the loop structure portion LOOP is "0" (GND), thereby the output signal Q is "0" (GND).

At the next time point R3, the control signal SELm becomes "1" (VDD2) so as to select the m-th storage area as a read source of the data D, and other control signals SEL1 to SEL(m−1) become "0" (GND). Thus, the demultiplexers DeMUX1 and DeMUX2 become the state where the signal path connecting the input end and the m-th output end is selected, while the multiplexers MUX3 and MUX4 become the state where the signal path connecting the output end and the m-th input end is selected.

In addition, at the time point R3, in the state where the control signals E1 and E2 are both "0" (GND) (i.e., in the state where the data write drivers are disabled and the normal loop is disabled in the loop structure portion LOOP), the first power supply voltage VDD1 for the loop structure portion LOOP and the second power supply voltage VDD2 for the nonvolatile storage portion NVM are turned on.

Note that during the time points R3 to R4, the control signal E2 becomes "0" (GND) so that the second input ends (0) of the multiplexer MUX1 and the multiplexer MUX2 are selected. Therefore, the logic level of the node voltage V3 becomes WL while the logic level of the node voltage V4 becomes WH. In addition, the logic level of the node voltage V5 becomes WH while the logic level of the node voltage V6 becomes WL. In this way, during the time points R3 to R4, the node voltages V1 to V6 of the individual portions of the device are still in an unstable state (the state where the logic level inversion is not completed in the inverter INV3 and the inverter INV4 so that output logic levels thereof are not completely "0" (GND) or "1" (VDD1)).

At the next time point R4, the control signal E2 becomes "1" (VDD1), and the first input ends (1) of the multiplexer MUX1 and the multiplexer MUX2 are selected, so that the normal loop is formed in the loop structure portion LOOP. When the signal path is switched in this way, the output end of the inverter INV4 (having the logic level of WH) is connected to the input end of the inverter INV3 (having the logic level of WH), while the output end of the inverter INV3 (having the logic level of WL) is connected to the input end of the inverter INV4 (having the logic level of WL). Therefore, no mismatch occurs in the signal logic level (WH or WL) of each node. After that, during the period while the normal loop is formed in the loop structure portion LOOP, the inverter INV3 receives the input of the logic level WL and tries to raise the output logic level to "1" (VDD1) while the inverter INV4 receives the input of the logic level WH and tries to lower the output logic level to "0" (GND). As a result, the output logic level of the inverter INV3 is secured to be "0" (GND) from the unstable logic level WL, and the output logic level of the inverter INV4 is secured to be "1" (VDD1) from the unstable logic level WH.

In this way, at the time point R4, as the loop structure portion LOOP becomes the normal loop, the signal read out from the ferroelectric element (potential difference between the node voltage V1m and the node voltage V2m) is amplified by the loop structure portion LOOP. Thus, the stored data in the third storage area ("1" (VDD1) in the example of FIG. 20) is restored as the output signal Q.

After that, at the time point R5, the F reset signal FRSTm becomes "1" (VDD2) again, so that the transistors Q1ma, Q1mb, Q2ma and Q2mb are turned on. Therefore, each of the ferroelectric elements CL1ma, CL1mb, CL2ma and CL2mb is short-circuited at the ends, so that no voltage can be applied to the ferroelectric elements CL1ma, CL1mb, CL2ma and CL2mb. In this case, each of the plate line PL1m and the plate line PL2m is "0" (GND). Therefore, the data holding device is reset to be the normal operation state that is the same as the state before the time point W1.

As described above, the data reading action of FIG. 20 is different from the data reading action of FIG. 19 in that the former starts to derive the voltage signals (node voltages V1m and V2m) corresponding to the remanent polarization state inside the ferroelectric element before the first power supply voltage VDD1 and the second power supply voltage VDD2 are turned on. With this structure, it is possible to reduce operation steps after the first power supply voltage VDD1 and the second power supply voltage VDD2 are turned on (the operational example of FIG. 19 requires three steps (time points R3, R4 and R5) while the operational example of FIG. 20 requires only two steps (time points R4 and R5)), so that time necessary for resetting to the normal operation can be shortened.

Figure 21:
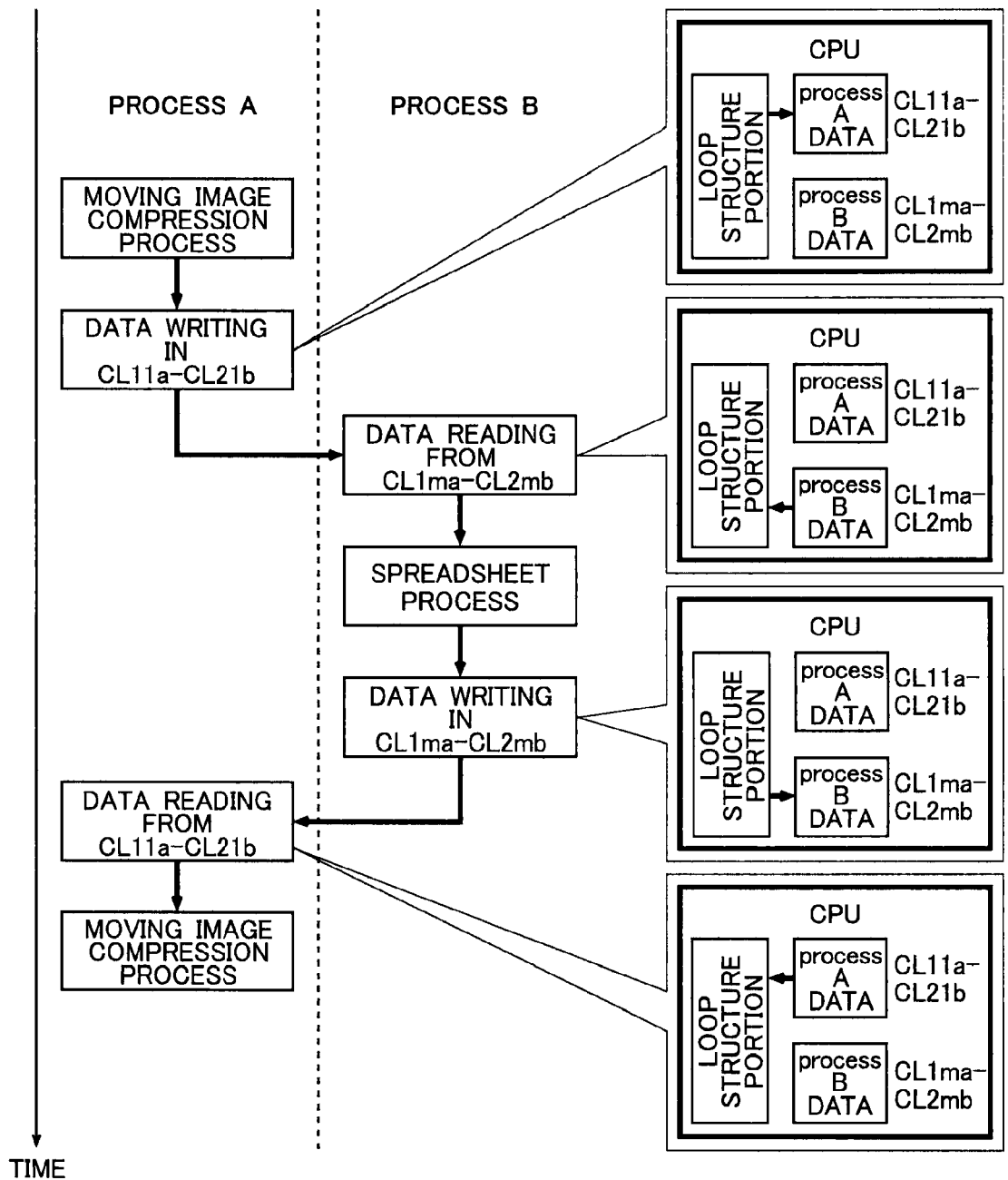
FIG. 21 is a schematic diagram illustrating an example of a process switching action by exchanging data.

Next, a process switching action in the case where the data holding device of the fourth variation example is applied to a CPU will be described with reference to FIG. 21. FIG. 21 is a schematic diagram illustrating an example of the process switching action by exchanging data, which schematically illustrates a manner of exchanging a process A (e.g., moving image compression process) and a process B (e.g., a spreadsheet process) alternately by exchanging the first storage area and the m-th storage area of the data holding device arbitrarily. Note that the left part of FIG. 21 illustrates a manner of exchanging the process A and the process B alternately with the vertical axis as a time axis, while the right part of FIG. 21 schematically illustrates operational state of the data holding device that is used inside the CPU.

When the process A is switched to the process B, the data holding device writes the data DA concerning the process A in the first storage area (CL11a-CL21b) and reads out the data DB concerning the process B from the m-th storage area (CL1ma-CL2mb), so as to perform a data exchange process of data stored in the data holding device. On the other hand, when the process B is switched to the process A in the opposite manner to the above description, the data holding device writes the data DB concerning the process B in the m-th storage area (CL1ma-CL2mb) and reads out the data DA concerning the process A from the first storage area (CL11a-CL21b), so as to perform the data exchange process of data stored in the data holding device. By this data exchange process, it is possible to exchange instantly the processes executed by the CPU.

Note that the power supply off period illustrated in FIGS. 19 and 20 is not always necessary when the process switching of the CPU is performed by exchanging data.

Next, a layout of a cell pattern of the ferroelectric element will be described in detail with reference to FIGS. 22 to 25. FIGS. 22 to 25 are schematic diagrams respectively illustrating of a first layout example to a fourth layout example of the cell pattern of the ferroelectric element. Note that each of reference signs a to d in FIGS. 22 to 25 indicates the ferroelectric element, and each of reference signs x and y indicates a distance between the elements.

When a plurality of ferroelectric elements are formed on a semiconductor substrate, the ferroelectric elements are designed to have the same shape (e.g., a square shape or a rectangle shape viewed from the top) at the layout stage. However, an actual element shape formed on the semiconductor substrate via a masking process and an etching process does not become the same shape as designed in most cases because of characteristics of the process.

Figure 22:
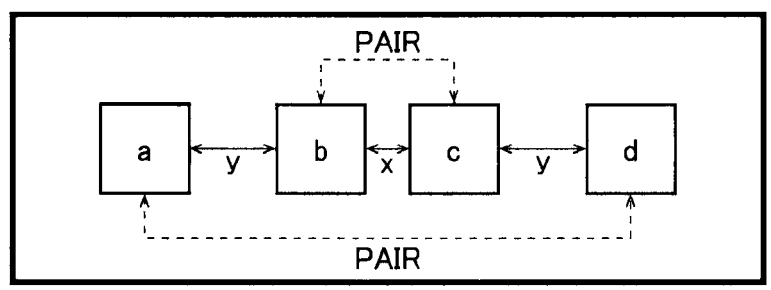
FIG. 22 is a schematic diagram illustrating a first layout example of a cell pattern.
Figure 22:
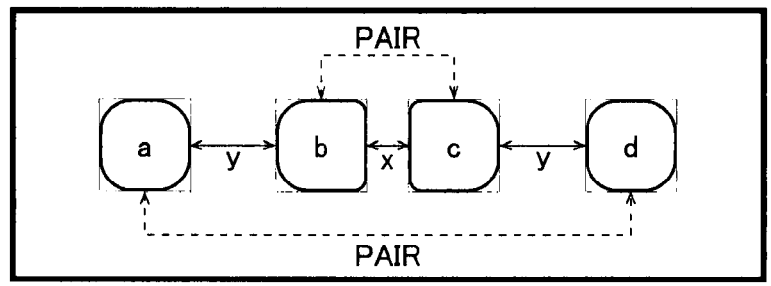
Figure 23:
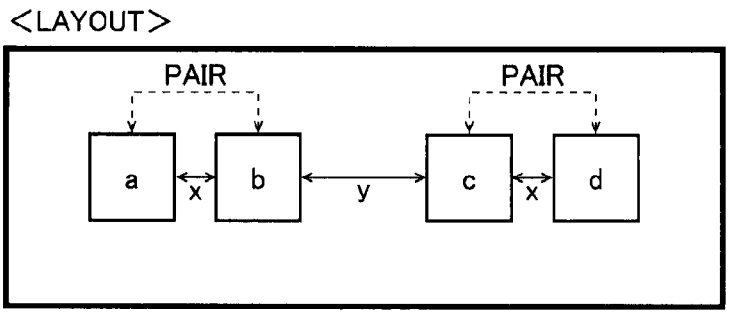
FIG. 23 is a schematic diagram illustrating a second layout example of the cell pattern.
Figure 23:
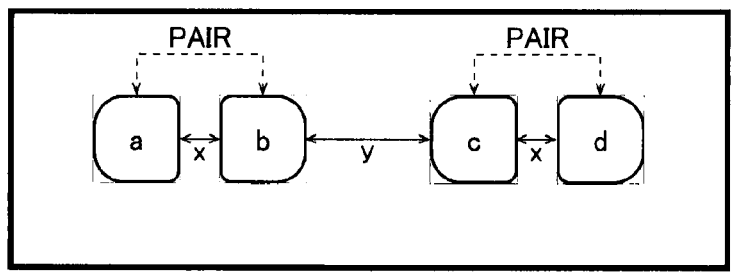
Figure 23:
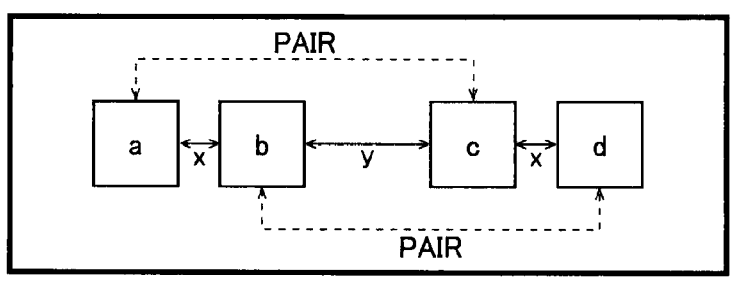
Figure 23:
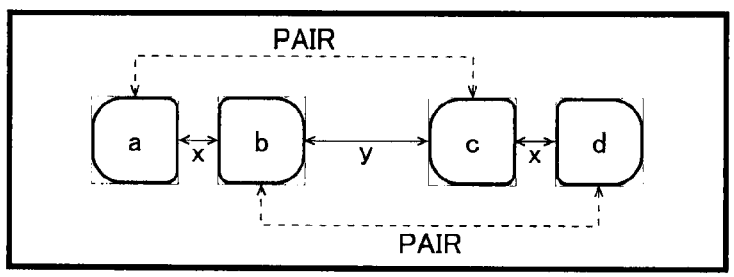
Figure 24:
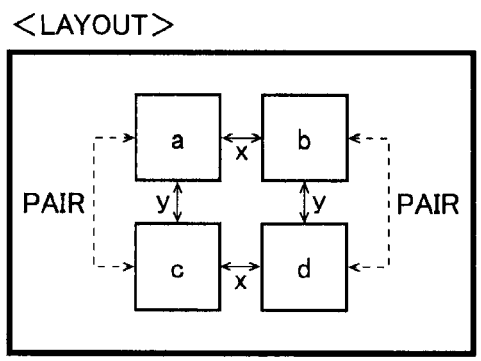
FIG. 24 is a schematic diagram illustrating a third layout example of the cell pattern.
Figure 24:
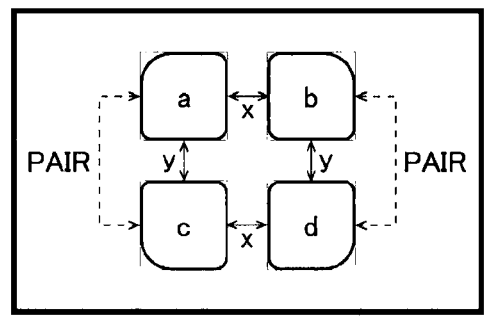
Figure 24:
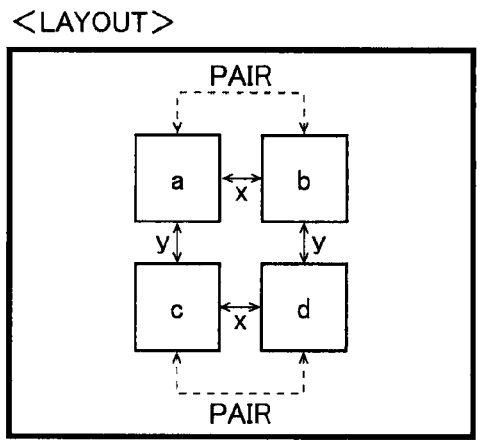
Figure 24:
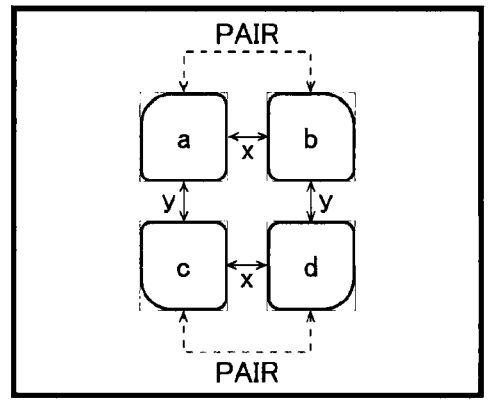
Figure 24:
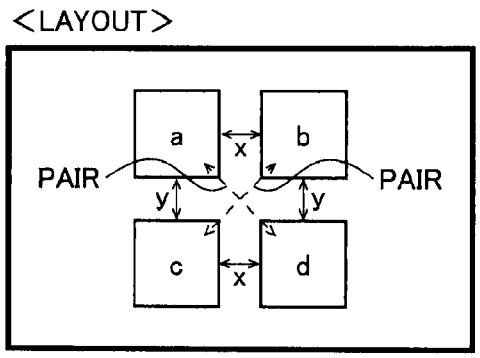
Figure 24:
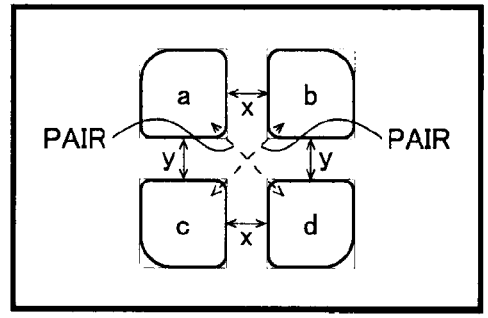
Figure 25:
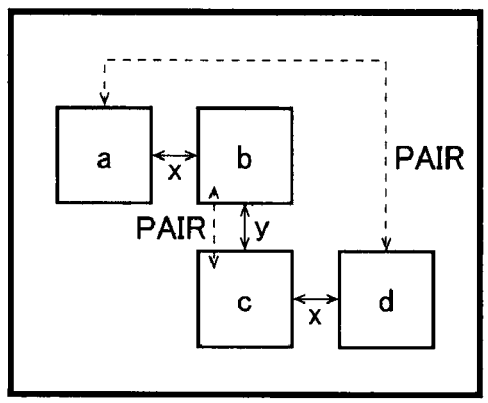
FIG. 25 is a schematic diagram illustrating a fourth layout example of the cell pattern.
Figure 25:
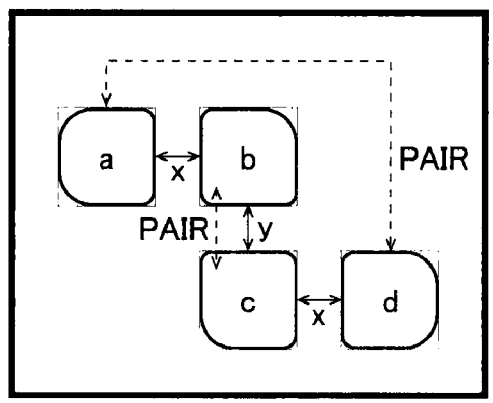

For instance, in FIG. 22, each of the ferroelectric elements a and d has four sides that are not close to other elements, so that corner portions of the element are etched easily. Therefore, the actual element shape formed on the semiconductor substrate has four corner portions that are all rounded relatively largely. On the other hand, each of the ferroelectric elements b and c has a side facing closely to each other, so the corner portions of the element including the side are hardly etched. The actual element shape formed on the semiconductor substrate has four corner portions two of which are opposed to each other and are rounded relatively small, while other two corner portions are rounded relatively largely. The above description is also true for the example of FIGS. 23 to 25.

In this way, the actual element shape formed on the semiconductor substrate has different etched amount of four corners in accordance with a density of the elements. A pair of the ferroelectric element CL1a and the ferroelectric element CL1b, as well as a pair of the ferroelectric element CL2a and the ferroelectric element CL2b should be arranged so that the actual shapes formed on the semiconductor substrate become equal to each other.

In case of the example of FIG. 22, the ferroelectric elements a and d constitute a first pair while the ferroelectric elements b and c constitute a second pair. In addition, in case of the example of FIG. 23, the ferroelectric elements a and b may constitute a first pair while the ferroelectric elements c and d may constitute a second pair (see (a) in FIG. 23). Alternatively, the ferroelectric elements a and c may constitute a first pair while the ferroelectric elements b and d may constitute a second pair (see (b) in FIG. 23). In addition, in case of the example of FIG. 24, the ferroelectric elements a and c may constitute a first pair while the ferroelectric elements b and d may constitute a second pair (see (a) in FIG. 24). Alternatively, the ferroelectric elements a and b may constitute a first pair while the ferroelectric elements c and d may constitute a second pair (see (b) in FIG. 24). Alternatively, the ferroelectric elements a and d may constitute a first pair while the ferroelectric elements b and c may constitute a second pair (see (c) in FIG. 24). In addition, in case of the example of FIG. 25, the ferroelectric elements a and d constitute a first pair while the ferroelectric elements b and c constitute a second pair.

By performing such the layout of the cell pattern, shapes (areas) of the ferroelectric elements to constitute a pair can be equalized so that matching between them can be enhanced, thereby data holding characteristic of the data holding device can be improved.

In addition, as illustrated in FIG. 18, the above description is true also for the case in which a plurality of storage areas are provided. In this case, it is important to equalize shapes (areas) of pairs of the ferroelectric elements CL11a-CL1ma and the ferroelectric elements CL11b-CL1mb as well as pairs of the ferroelectric elements CL21a-CL1ma and the ferroelectric elements CL21b-CL2mb.

Note that the structure of the present invention can be modified variously other than the embodiment described above in the scope of the spirit of the present invention without deviating from the same.

For instance, the embodiment described above exemplifies the structure in which the inverter or the NOT-AND circuit is used as the logic gate constituting the loop structure portion LOOP. However, the present invention is not limited to this structure and may use other logic gate such as a NOT-OR circuit.

In addition, the embodiment described above exemplifies the structure in which a combination of inverters INV6 and INV7 and the pass switches SW3 and SW4 is used as a structural element of the circuit separating portion SEP for electrically separating the loop structure portion LOOP and the nonvolatile storage portion NVM from each other. However, the present invention is not limited to this structure and may use the three-state inverters INV6' and INV7' (that can make the output be a floating state) instead of the above-mentioned element as described above with reference to FIG. 7.

In addition, the point of the circuit separating portion SEP is that a voltage is not applied to the ferroelectric element in the normal operation. Other than the structure exemplified in the embodiment described above (i.e., the structure in which the applied voltage to the ferroelectric element is kept to be a constant voltage in the normal operation), it can be considered to adopt another structure in which at least one of the electrodes of the ferroelectric element for receiving the voltage is kept to be a floating state. Specifically, it can be considered to adopt a method of turning off the transistors Q1a, Q1b, Q2a and Q2b while making the first plate line PL1 and the second plate line PL2 be the floating state in the normal operation in FIG. 1, or other methods. In addition, if the circuit structure itself is modified, an additional transistor may be disposed between the ferroelectric element and the outlet end of the node voltage V1 (V2), or between the ferroelectric element and the plate line PL1 (PL2), so that on-off control of the transistor is performed.

In addition, if the applied voltage to the ferroelectric element is kept to be constant in the normal operation or in the data reading action, the transistor connected between the ends of the ferroelectric element should be turned on, but the voltage of the plate line is not necessarily the low level.

In addition, the above description exemplifies the structure in which the second power supply voltage VDD2 that is supplied to the nonvolatile storage portion NVM is higher than the first power supply voltage VDD1 that is supplied to the loop structure portion LOOP. However, the present invention is not limited to this structure, and another structure may be considered in which the second power supply voltage VDD2 is lower than the first power supply voltage VDD1.

As described above, in the nonvolatile logic technique, the ferroelectric element is driven so as to save or restore the register data when the power supply is turned off or on, or at other timing. Here, if the voltage level used for driving the ferroelectric element is reduced as much as possible, the power consumption in driving the ferroelectric element can be reduced.

For instance, the loop structure portion LOOP may be driven by the first power supply voltage VDD1 of 3.3 volts while the nonvolatile storage portion NVM may be driven by the second power supply voltage VDD2 of 1.5 volts. Then, it can be avoided to consume a large power wastefully in driving the ferroelectric element.

Figure 26:
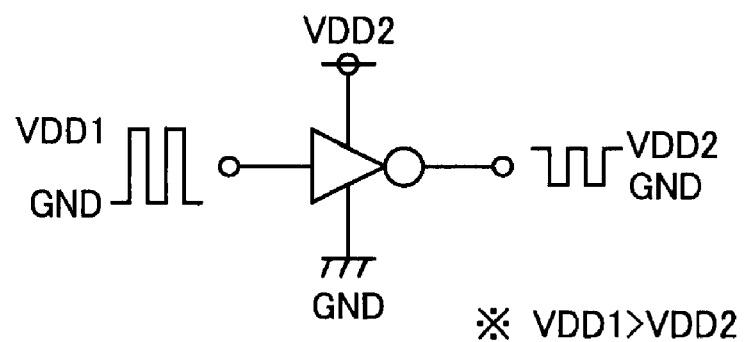
FIG. 26 is a diagram illustrating an example of the inverters INV6 and INV7 that are used in the case where a second power supply voltage VDD2 is lower than the first power supply voltage VDD1.
Figure 27:
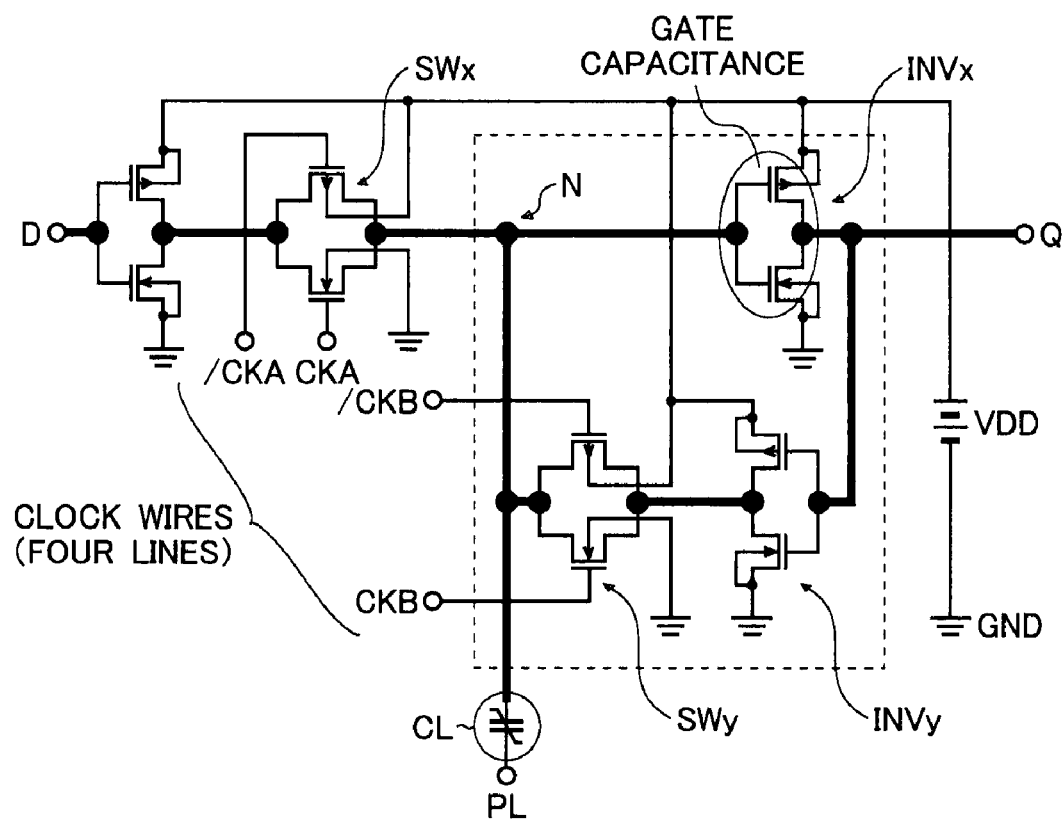
FIG. 27 is a circuit diagram illustrating a conventional example of the data holding device.
Figure 28:
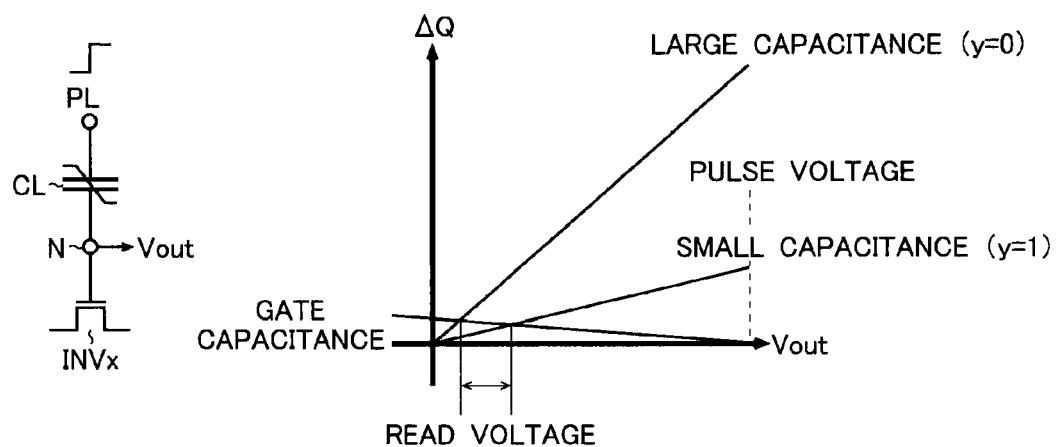
FIG. 28 is a diagram illustrating a conventional data reading method.

Note that if the loop structure portion LOOP is driven by a high voltage while the nonvolatile storage portion NVM is driven by a low voltage as described above, the inverters INV6 and INV7 constituting the circuit separating portion SEP are not required to have the level shifter function (see FIGS. 2 and 8). As illustrated in FIG. 26, it is possible to use a simple inverter that is driven by the second power supply voltage VDD2 that is lower than the first power supply voltage VDD1.

In addition, concerning industrial availability of the present invention, the present invention is a useful technique for realizing a nonvolatile operation of the data holding device that is used for a logical arithmetic circuit, a logical arithmetic device, a processor such as a CPU, an MPU or a DSP, a mobile device, or the like.

Note that the best embodiment of the present invention is described above, but the disclosed invention can be modified in various methods and can have various embodiments different from the concrete structure described above, as obvious to a person having ordinary skill in the art. Therefore, the claims are intended to include every variation of the present invention in the technical scope without deviating from the spirit or the technical field of view of the present invention.

What is claimed is:

1. A data holding device comprising:
a loop structure portion for holding data by using a plurality of logic gates connected like a loop;
a nonvolatile storage portion for storing data held in the loop structure portion, in a nonvolatile manner by using a hysteresis characteristic of a ferroelectric element; and
a circuit separating portion for electrically separating the loop structure portion and the nonvolatile storage portion from each other, wherein
the loop structure portion and the nonvolatile storage portion are driven by being respectively supplied with first and second power supply voltages that are different from each other,
the circuit separating portion includes a level shifter for converting a voltage level of the data communicated between the loop structure portion and the nonvolatile storage portion,
the second power supply voltage that is supplied to the nonvolatile storage portion is higher than the first power supply voltage that is supplied to the loop structure portion, and
the circuit separating portion makes the loop structure portion operate electrically while maintaining an applied voltage to the ferroelectric element to be constant during a normal operation of the data holding device.

2. The data holding device according to claim 1, wherein the data holding device uses a capacitive coupling between the ferroelectric element in a non-inverted state and the ferroelectric element in an inverted state when data is read out from the ferroelectric element.

3. The data holding device according to claim 1, wherein the data holding device uses a capacitive coupling between the ferroelectric element and another capacitance element when data is read out from the ferroelectric element.

4. A data holding device comprising:
a loop structure portion for holding data by using a plurality of logic gates connected like a loop;
a nonvolatile storage portion for storing data held in the loop structure portion, in a nonvolatile manner by using a hysteresis characteristic of a ferroelectric element; and
a circuit separating portion for electrically separating the loop structure portion and the nonvolatile storage portion from each other, wherein
the loop structure portion and the nonvolatile storage portion are driven by being respectively supplied with first and second power supply voltages that are different from each other,
the circuit separating portion includes a level shifter for converting a voltage level of the data communicated between the loop structure portion and the nonvolatile storage portion,
the second power supply voltage that is supplied to the nonvolatile storage portion is lower than the first power supply voltage that is supplied to the loop structure portion, and
the circuit separating portion makes the loop structure portion operate electrically while maintaining an applied voltage to the ferroelectric element to be constant during a normal operation of the data holding device.

5. The data holding device according to claim 4, wherein the data holding device uses a capacitive coupling between the ferroelectric element in a non-inverted state and the ferroelectric element in an inverted state when data is read out from the ferroelectric element.

6. The data holding device according to claim 4, wherein the data holding device uses a capacitive coupling between the ferroelectric element and another capacitance element when data is read out from the ferroelectric element.

7. A data holding device comprising:
a loop structure portion for holding data by using a plurality of logic gates connected like a loop;
a nonvolatile storage portion for storing data held in the loop structure portion, in a nonvolatile manner by using a hysteresis characteristic of a ferroelectric element; and
a circuit separating portion for electrically separating the loop structure portion and the nonvolatile storage portion from each other, wherein the loop structure portion and the nonvolatile storage portion are driven by being respectively supplied with first and second power supply voltages that are different from each other, the circuit separating portion includes a level shifter for converting a voltage level of the data communicated between the loop structure portion and the nonvolatile storage portion, the second power supply voltage that is supplied to the nonvolatile storage portion is higher than the first power supply voltage that is supplied to the loop structure portion, and the circuit separating portion makes the loop structure portion operate electrically while maintaining at least one of electrodes of the ferroelectric element for receiving a voltage to be a floating state during a normal operation of the data holding device.

8. The data holding device according to claim 7, wherein the data holding device uses a capacitive coupling between the ferroelectric element in a non-inverted state and the ferroelectric element in an inverted state when data is read out from the ferroelectric element.

9. The data holding device according to claim 7, wherein the data holding device uses a capacitive coupling between the ferroelectric element and another capacitance element when data is read out from the ferroelectric element.

10. A data holding device comprising:
a loop structure portion for holding data by using a plurality of logic gates connected like a loop;
a nonvolatile storage portion for storing data held in the loop structure portion, in a nonvolatile manner by using a hysteresis characteristic of a ferroelectric element; and
a circuit separating portion for electrically separating the loop structure portion and the nonvolatile storage portion from each other, wherein the loop structure portion and the nonvolatile storage portion are driven by being respectively supplied with first and second power supply voltages that are different from each other, the circuit separating portion includes a level shifter for converting a voltage level, of the data communicated between the loop structure portion and the nonvolatile storage portion, the second power supply voltage that is supplied to the nonvolatile storage portion is lower than the first power supply voltage that is supplied to the loop structure portion, and the circuit separating portion makes the loop structure portion operate electrically while maintaining at least one of electrodes of the ferroelectric element for receiving a voltage to be a floating state during a normal operation of the data holding device.

11. The data holding device according to claim 10, wherein the data holding device uses a capacitive coupling between the ferroelectric element in a non-inverted state and the ferroelectric element in an inverted state when data is read out from the ferroelectric element.

12. The data holding device according to claim 10, wherein the data holding device uses a capacitive coupling between the ferroelectric element and another capacitance element when data is read out from the ferroelectric element.

* * * * *